(12) United States Patent  
Marzaki

(10) Patent No.: US 12,230,565 B2  
(45) Date of Patent: Feb. 18, 2025

(54) INTEGRATED FILLER CAPACITOR CELL DEVICE AND CORRESPONDING MANUFACTURING METHOD

(71) Applicant: STMicroelectronics (Rousset) SAS, Rousset (FR)

(72) Inventor: Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 18/437,720

(22) Filed: Feb. 9, 2024

(65) Prior Publication Data

US 2024/0186236 A1 Jun. 6, 2024

Related U.S. Application Data

(60) Continuation of application No. 18/116,672, filed on Mar. 2, 2023, now Pat. No. 11,935,828, which is a (Continued)

(30) Foreign Application Priority Data

Jan. 9, 2018 (FR) ...................................... 1850157

(51) Int. Cl.  
*H01L 29/66* (2006.01)  
*H01L 21/762* (2006.01)  
(Continued)

(52) U.S. Cl.  
CPC .... *H01L 23/5223* (2013.01); *H01L 21/76224* (2013.01); *H01L 27/0805* (2013.01); *H01L 29/66181* (2013.01)

(58) Field of Classification Search  
CPC ......... H01L 21/76224; H01L 29/66181; H01L 28/40–92; H01L 23/5223; H01L 23/5222; (Continued)

(56) References Cited

U.S. PATENT DOCUMENTS 5,581,110 A 12/1996 Razouk et al.  
5,805,494 A 9/1998 El-Kareh et al.  
(Continued)

FOREIGN PATENT DOCUMENTS

CN 1495852 A 5/2004  
CN 101753008 A 6/2010  
(Continued)

OTHER PUBLICATIONS

La Rosa, F., et al.: "40nm Embedded Select in Trench Memory (eSTM) Technology Overview," 2019 IEEE 11th International Memory Workshop, 4 pages.  
(Continued)

*Primary Examiner* — Moazzam Hossain  
(74) *Attorney, Agent, or Firm* — Crowe & Dunlevy LLC

(57) ABSTRACT

A semiconductor region includes an isolating region which delimits a working area of the semiconductor region. A trench is located in the working area and further extends into the isolating region. The trench is filled by an electrically conductive central portion that is insulated from the working area by an isolating enclosure. A cover region is positioned to cover at least a first part of the filled trench, wherein the first part is located in the working area. A dielectric layer is in contact with the filled trench. A metal silicide layer is located at least on the electrically conductive central portion of a second part of the filled trench, wherein the second part is not covered by the cover region.

23 Claims, 12 Drawing Sheets

Related U.S. Application Data division of application No. 17/173,275, filed on Feb. 11, 2021, now Pat. No. 11,621,222, which is a continuation-in-part of application No. 16/242,529, filed on Jan. 8, 2019, now Pat. No. 10,943,862.

(51) Int. Cl.
*H01L 23/522* (2006.01)
*H01L 27/08* (2006.01)

(58) Field of Classification Search
CPC ............. H01L 23/49589; H01L 23/642; H01L 29/945; H01L 27/0805; H01L 27/0629
See application file for complete search history.

(56) References Cited

U.S. PATENT DOCUMENTS

| | | |
|---|---|---|
| 6,391,707 B1 | 5/2002 | Dirnecker et al. |
| 7,022,565 B1 | 4/2006 | Kao |
| 7,449,744 B1 | 11/2008 | Yu et al. |
| 8,085,524 B2 | 12/2011 | Roozeboom et al. |
| 8,492,820 B2 | 7/2013 | Anderson et al. |
| 8,525,245 B2 | 9/2013 | Erickson et al. |
| 8,816,470 B2 | 8/2014 | Erickson et al. |
| 9,159,723 B2 | 10/2015 | Chou et al. |
| 9,178,080 B2 | 11/2015 | Kalnitsky et al. |
| 9,349,793 B2 | 5/2016 | Jaffe et al. |
| 9,978,829 B2 | 5/2018 | Lin |
| 10,049,890 B2 | 8/2018 | Chou et al. |
| 10,084,035 B2 | 9/2018 | Papavasilion et al. |
| 10,109,601 B2 | 10/2018 | Marzaki |
| 10,818,669 B2 | 10/2020 | Marzaki et al. |
| 2002/0019110 A1 | 2/2002 | Lee et al. |
| 2004/0137667 A1 | 7/2004 | Ogawa et al. |
| 2006/0124982 A1* | 6/2006 | Ho ........................ H01L 29/945 257/E21.396 |
| 2006/0246656 A1 | 11/2006 | Kudelka et al. |
| 2007/0045699 A1 | 3/2007 | Liao et al. |
| 2007/0054461 A1 | 3/2007 | Su |
| 2007/0057302 A1 | 3/2007 | Ho et al. |
| 2007/0238244 A1* | 10/2007 | Lin ........................ H01L 29/945 438/386 |
| 2007/0278612 A1 | 12/2007 | Williams et al. |
| 2009/0039466 A1 | 2/2009 | Sanada |
| 2009/0095998 A1 | 4/2009 | Ho et al. |
| 2011/0018094 A1 | 1/2011 | Chapman et al. |
| 2011/0165755 A1 | 7/2011 | Zundel et al. |
| 2011/0169065 A1 | 7/2011 | Cheng et al. |
| 2011/0298085 A1 | 12/2011 | Terletzki |
| 2012/0032260 A1 | 2/2012 | Hirler et al. |
| 2012/0267759 A1 | 10/2012 | Shroff et al. |
| 2013/0049089 A1 | 2/2013 | Baars et al. |
| 2013/0069198 A1 | 3/2013 | Claeys et al. |
| 2013/0161792 A1 | 6/2013 | Tran et al. |
| 2014/0061780 A1 | 3/2014 | Son et al. |
| 2014/0117499 A1 | 5/2014 | Yang et al. |
| 2014/0145299 A1 | 5/2014 | Kalnitsky et al. |
| 2014/0264523 A1* | 9/2014 | Loechelt ............ H01L 29/0878 438/386 |
| 2014/0264724 A1 | 9/2014 | Cheng et al. |
| 2015/0061075 A1 | 3/2015 | Yeh |
| 2015/0236031 A1 | 8/2015 | Mantelli et al. |
| 2016/0020267 A1 | 1/2016 | Lin |
| 2016/0218071 A1 | 7/2016 | Nam et al. |
| 2019/0074363 A1 | 3/2019 | Zhu |

FOREIGN PATENT DOCUMENTS

| | | |
|---|---|---|
| CN | 105914206 A | 8/2016 |
| CN | 106170858 A | 11/2016 |
| CN | 106298796 A | 1/2017 |
| EP | 1335425 A1 | 8/2003 |
| FR | 2894708 A1 | 6/2007 |
| FR | 3013148 A1 | 5/2015 |
| FR | 3021457 A1 | 11/2015 |
| JP | 2003124344 A | 4/2003 |
| JP | 2008071861 A | 3/2008 |
| WO | 2007005141 A1 | 1/2007 |

OTHER PUBLICATIONS

CN Allowance for counterpart CN Application No. 201910011777.0, report dated Jan. 4, 2024, 6 pgs.

INPI Search Report and Written Opinion for FR 1850157 dated Sep. 10, 2018 (8 pages).

First Office Action and Search Report for counterpart CN Appl. No. 201910011777.0, report dated Mar. 23, 2023, 10 pgs.

\* cited by examiner

INTEGRATED FILLER CAPACITOR CELL DEVICE AND CORRESPONDING MANUFACTURING METHOD

CROSS-REFERENCE TO RELATED APPLICATIONS

This application is a continuation of U.S. patent application Ser. No. 18/116,672, filed Mar. 2, 2023, which is a divisional of U.S. patent application Ser. No. 17/173,275 filed Feb. 11, 2021, which is a Continuation-In-Part (CIP) of U.S. patent application Ser. No. 16/242,529 filed Jan. 8, 2019, which claims the priority benefit of French Application for Patent No. 1850157, filed on Jan. 9, 2018, the contents of which are hereby incorporated by reference in their entireties to the maximum extent allowable by law.

TECHNICAL FIELD

Embodiments and applications relate to integrated circuits, particularly filler capacitor cells (or "filler capacitors") which occupy the empty spaces of integrated circuits and may be used, for example, as decoupling capacitors.

BACKGROUND

Filler capacitor cells are commonly used, notably, in logic parts of integrated circuits.

As shown in FIG. 1, which is a top view of part of an integrated circuit, the logic parts LG of an integrated circuit comprise an alternation of n-type semiconductor wells NW and p-type semiconductor wells PW, in which the logic gates made by complementary technology (CMOS) are formed.

For reasons of architecture, the logic part LG comprises empty spaces in which no logic gates are formed. Filler capacitor cells FC are then formed in these empty spaces, in order to optimize the use of the surface of the logic part.

Filler capacitor cells FC are used, for example, to supplement decoupling capacitors DECAP located at the edge of the logic part LG, the overall dimensions of which are usually already large.

FIG. 2 shows a sectional view of a filler capacitor cell 200 comprising trenches 20 filled with a conductive material 21 enclosed by an isolating enclosure 22. The trenches 20 are located in a working area of a well NW of the logic part LG of an integrated circuit.

The working area is a region that is not covered by shallow isolation trenches STI, and is usually intended to receive active elements of integrated circuits such as transistors.

The well NW forms a first electrode E1 of the capacitor, intended to be coupled to a supply voltage, and the conductive material 21 filling the trenches 20 forms a second electrode E2 of this capacitor, intended to be coupled to a reference voltage.

The substrate or well PW is usually connected to the second electrode E2, forming a reverse diode with the well NW to prevent current leakage between the two electrodes E1, E2 of the capacitor 200.

This type of architecture using trenches 20 provides a better surface capacitance than a conventional architecture in which the second electrode covers the surface of the working area of the well NW.

However, a step of silicidation (that is to say, the formation of a layer of metal silicide), an essential part of the manufacturing methods, generates a film of metal silicide 28 on the surfaces of the exposed parts of the working area and of the conductive material 21 filling the trenches 20.

Although it is relatively thick (from 8 to 10 nm, for example), the isolating enclosure 22 separating the well NW and the conductive material 21 filling the trenches 20 is short-circuited (29) by the metal silicide film 28, as a result of surface edge effects.

The short circuits 29 reduce the surface capacitance and cause high current leakage between the two electrodes E1, E2 of the capacitor 200.

Consequently there is a need to overcome these drawbacks and to propose a compact filler capacitor cell device that reduces current leakage as far as possible.

SUMMARY

In an embodiment, an integrated circuit comprises at least one domain comprising at least one filler capacitor cell device, the device comprising: a first semiconductor region; an isolating region delimiting a working area of the first semiconductor region; at least one trench located in said working area and extending into the isolating region, the trench having a central electrically conductive portion enclosed by an isolating enclosure; a cover region covering at least a first part of said trench, the first part of said trench being the part located in said working area, the cover region comprising at least one dielectric layer in contact with said trench; a metal silicide layer located at least on the central portion of a second part of said trench, the second part of said trench being a part not covered by the cover region; a first contact in the first semiconductor region, forming a first electrode of the device; and a second contact on the metal silicide layer of the central portion of the second part of said trench.

Thus, with the cover region covering the central portion, at least on the part thereof located in the working area, the device is protected from short circuits between a surface metal silicide layer of the working area and a surface metal silicide layer of the central portion.

A part of the central portion that is not covered by the cover region, that is to say a part located in the isolating region, may, however, receive a metal silicide layer for connecting a second contact.

According to one embodiment, in which the integrated circuit comprises a substrate and a well housed in the substrate and forming said first semiconductor region, the device further comprises a substrate contact electrically connected to the second contact.

According to one embodiment, the cover region comprises an electrically conductive layer surmounting said dielectric layer and electrically connected to the second contact.

Such an electrically conductive layer of the cover region makes it possible, notably, to increase the capacitance of the capacitor device. This is because, with a parallel capacitive element comprising the first semiconductor region, the dielectric layer of the cover region and the electrically conductive layer of the cover region may thus be formed at no additional cost.

According to one embodiment, said dielectric layer of the cover region comprises a transistor gate oxide layer.

According to one embodiment, said dielectric layer of the cover region comprises a stack of oxide-nitride-silicon oxide layers.

According to one embodiment, the device comprises a plurality of parallel trenches in the working area.

According to one embodiment, said cover region takes the form of a plate covering the whole surface of the working area.

According to one embodiment, the device comprises a plurality of cover regions in the form of strips positioned facing each trench respectively.

For example, in this embodiment, the metal silicide layer may also be located on the surface of the working area, between said strips.

According to one embodiment, said domain comprises logic gates.

According to one embodiment, said domain comprises a sequence of wells in the substrate, and a plurality of capacitor cell devices located between logic gates.

Also proposed is an electronic apparatus such as a mobile phone or an on-board computer of a vehicle, comprising an integrated circuit as defined above.

According to another aspect, a method is proposed for manufacturing at least one filler capacitor cell device, in a domain of an integrated circuit, comprising: the formation of a first semiconductor region; the formation of an isolating region delimiting a working area of the first semiconductor region; the formation of at least one trench located in said working area and extending into the isolating region, comprising the etching of at least one trench, the formation of an isolating enclosure on the bottom and sides of said trench, and the formation of the cover region, comprising the formation of an electrically conductive central portion enclosed in said isolating enclosure; the formation of a cover region covering at least a first part of said trench, the first part of said trench being the part located in said working area, comprising the formation of a dielectric layer in contact with said trench; the formation of a metal silicide layer located at least on the central portion of a second part of said trench, the second part of said trench being a part not covered by the cover region; the formation of a first contact in the first semiconductor region to form a first electrode of the device; and the formation of a second contact on the metal silicide layer of the central portion of the second part of said trench.

Thus, at the time of the formation of metal silicide, with the cover region covering the central portion, at least on the part thereof located in the working area, the device is protected from short circuits between a surface metal silicide layer of the working area and a surface metal silicide layer of the central portion. This is because the formation of metal silicide films usually affects all the exposed parts of the silicon elements.

A part of the central portion that is not covered by the cover region, that is to say a part located in the isolating region, may, however, receive a metal silicide layer for connecting a second contact.

According to one embodiment, the formation of a first semiconductor region comprises the formation of a well in a substrate, the method further comprising the formation of a substrate contact electrically connected to the second contact.

According to one embodiment, the formation of the cover region comprises the formation of an electrically conductive layer surmounting said dielectric layer and electrically connected to the second contact.

According to one embodiment, the formation of the dielectric layer of the cover region comprises the formation of a transistor gate oxide layer.

According to one embodiment, the formation of the dielectric layer of the cover region comprises the formation of a stack of oxide-nitride-silicon oxide layers.

According to one embodiment, said formation of at least one trench comprises the formation of a plurality of parallel trenches located in said working area and extending into the isolating region.

According to one embodiment, said formation of at least one cover region is configured to form a plate covering the whole surface of the working area.

According to one embodiment, said formation of at least one cover region is configured to form strips arranged facing each trench.

In an embodiment, an integrated circuit comprises: a semiconductor well; an isolating region delimiting a working area of the semiconductor well; a trench located in the working area, wherein said trench is filled by an electrically conductive central portion enclosed in an isolating enclosure; a pair of strips overlying portions of the semiconductor well located on either side of said trench, wherein each strip includes an electrically conductive layer insulated from a corresponding one of the portions of the semiconductor well by a dielectric layer and a sidewall spacer, wherein the sidewall spacer extends over a side part of the electrically conductive central portion of the trench; layers of metal silicide located on a part of the electrically conductive central portion of the trench which is not covered by the sidewall spacer and on the electrically conductive layer; a first electrical contact to the semiconductor well forming a first electrode of a filler capacitor cell device; and a second electrical contact to said layer of the metal silicide located on the part of the electrically conductive central portion and on the electrically conductive layer forming a second electrode of the filler capacitor cell device.

In an embodiment, an integrated circuit comprises: a semiconductor substrate; an isolating region delimiting a working area of the semiconductor substrate; a plurality of strips overlying the semiconductor substrate, wherein each strip includes an electrically conductive layer insulated from the semiconductor substrate by a dielectric layer and a sidewall spacer; a plurality of trenches in the semiconductor substrate, wherein each trench is centered between an adjacent pair of strips of said plurality of strips, and wherein each trench is filled by an electrically conductive central portion enclosed in an isolating enclosure; wherein the sidewall spacers of the adjacent pair of strips extend over side parts of the electrically conductive layer for the trench centered between said adjacent pair of strips; a first metal silicide located on a part of the electrically conductive central portion of each trench which is not covered by the sidewall spacer; a second metal silicide located on the electrically conductive layer of each strip; a first electrical contact to the semiconductor substrate forming a first electrode of a filler capacitor cell device; and a second electrical contact to said first and second metal silicides forming a second electrode of the filler capacitor cell device.

In an embodiment, an integrated circuit comprises: a semiconductor well; an isolating region delimiting a working area of the semiconductor well; a pair of trenches located in the working area, wherein each trench is filled by an electrically conductive central portion enclosed in an isolating enclosure; a first doped region in a portion of the semiconductor well located between the pair of trenches; a pair of strips overlying said pair of trenches, wherein each strip includes an electrically conductive layer insulated from a corresponding one of the trenches by a dielectric layer and a sidewall spacer, wherein the sidewall spacer extends over a side part of the portion of the semiconductor well located between the pair of trenches; layers of metal silicide located on the first doped region between the pair of trenches which is not covered by the sidewall spacer, on a part of the electrically conductive central portion, and on the electrically conductive layer; a first electrical contact to said layer of metal silicide located on the first doped region forming a first electrode of a filler capacitor cell device; and a second electrical contact to said layer of the metal silicide located on the part of the electrically conductive central portion and on the electrically conductive layer forming a second electrode of the filler capacitor cell device.

In an embodiment, an integrated circuit comprises: a semiconductor substrate; an isolating region delimiting a working area of the semiconductor substrate; a plurality of strips overlying the semiconductor substrate, wherein each strip includes an electrically conductive layer insulated from the semiconductor substrate by a dielectric layer and a sidewall spacer; a plurality of trenches in the semiconductor substrate, wherein each trench is centered underneath a corresponding one of the strips of said plurality of strips, and wherein each trench is filled by an electrically conductive central portion enclosed in an isolating enclosure; wherein the sidewall spacers of an adjacent pair of strips extend over side parts of a portion of the semiconductor substrate located between the adjacent pair of strips; a plurality of first doped regions in the portions of the semiconductor substrate located between the adjacent pairs of strips; a first metal silicide located on a part of each first doped region not covered by the sidewall spacers of the strips; a second metal silicide located on the electrically conductive layer of each strip; a first electrical contact to the first metal silicide forming a first electrode of a filler capacitor cell device; and a second electrical contact to the second metal silicide forming a second electrode of the filler capacitor cell device.

BRIEF DESCRIPTION OF THE DRAWINGS

Other advantages and characteristics of the invention will be apparent from a perusal of the detailed description of embodiments and applications, which are not limiting in any way, and the appended drawings, in which.

DETAILED DESCRIPTION

Figure 1:
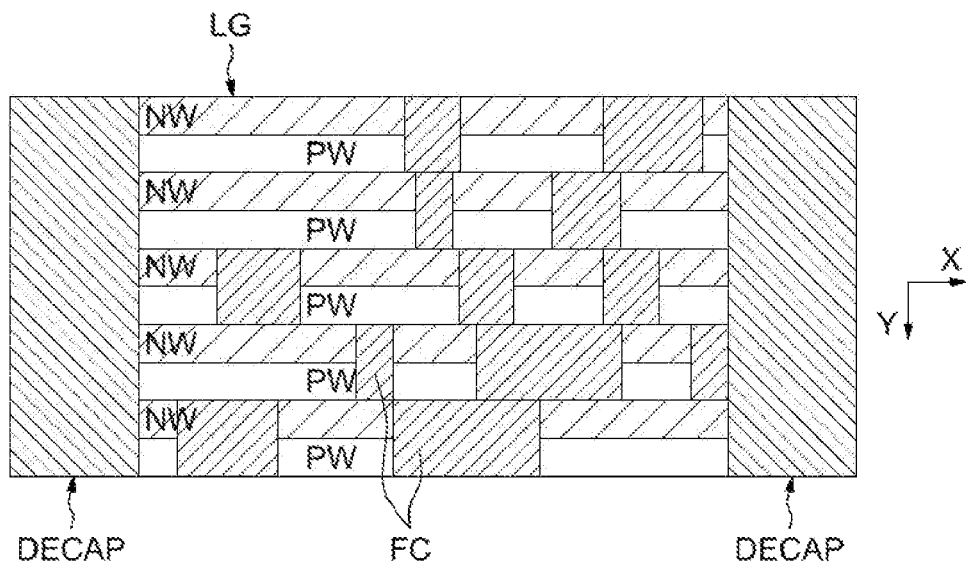
FIGS. 1 and 2, described above, show examples of commonly used filler capacitor cells.
Figure 2:
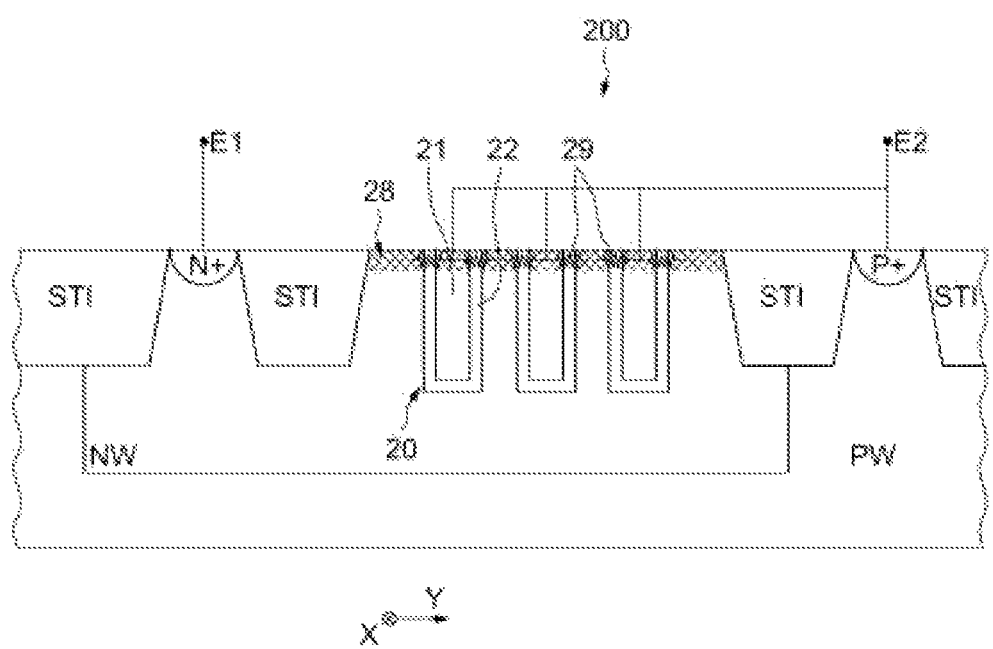
Figure 3A:
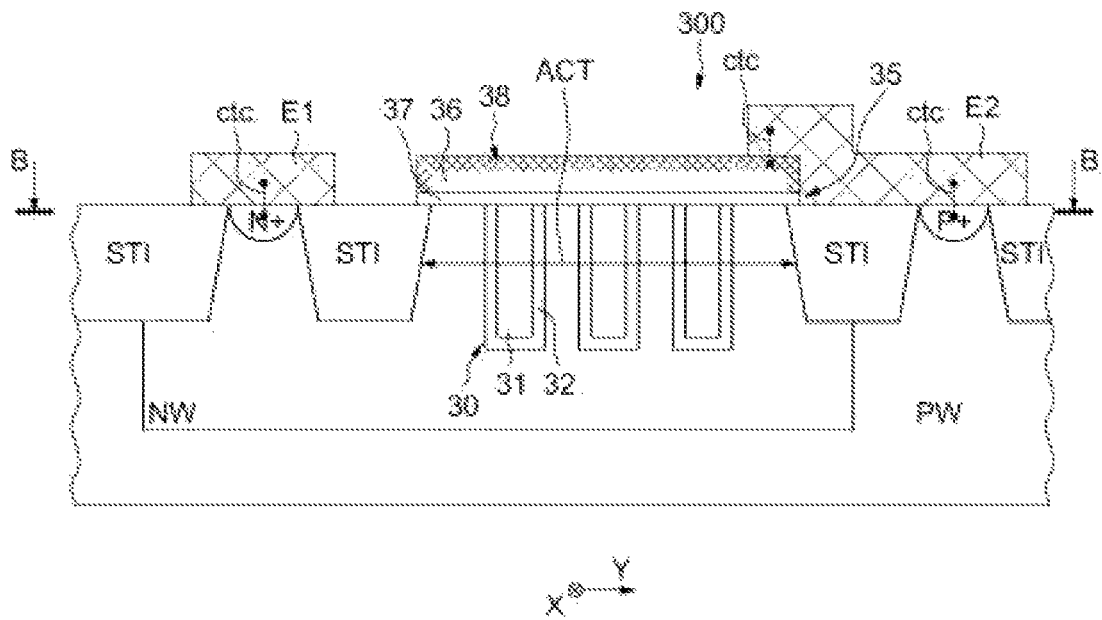
FIGS. 3A to 3C show an example of an embodiment of a filler capacitor cell.
Figure 3B:
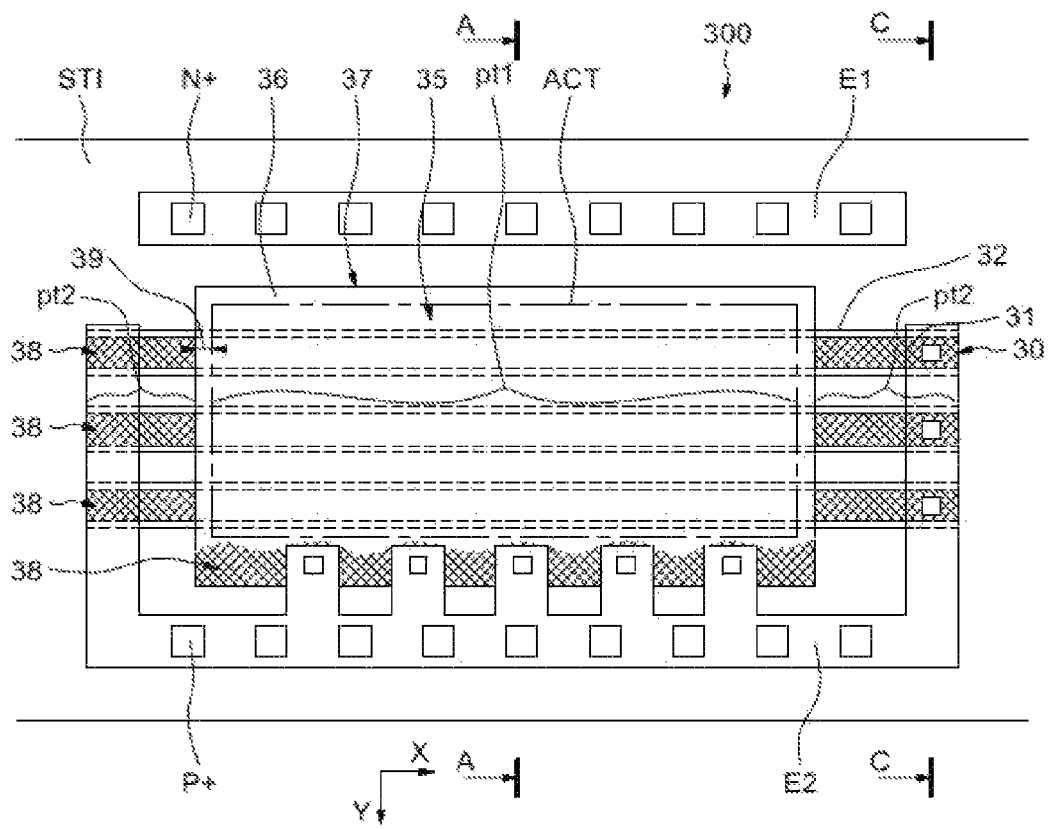
Figure 3C:
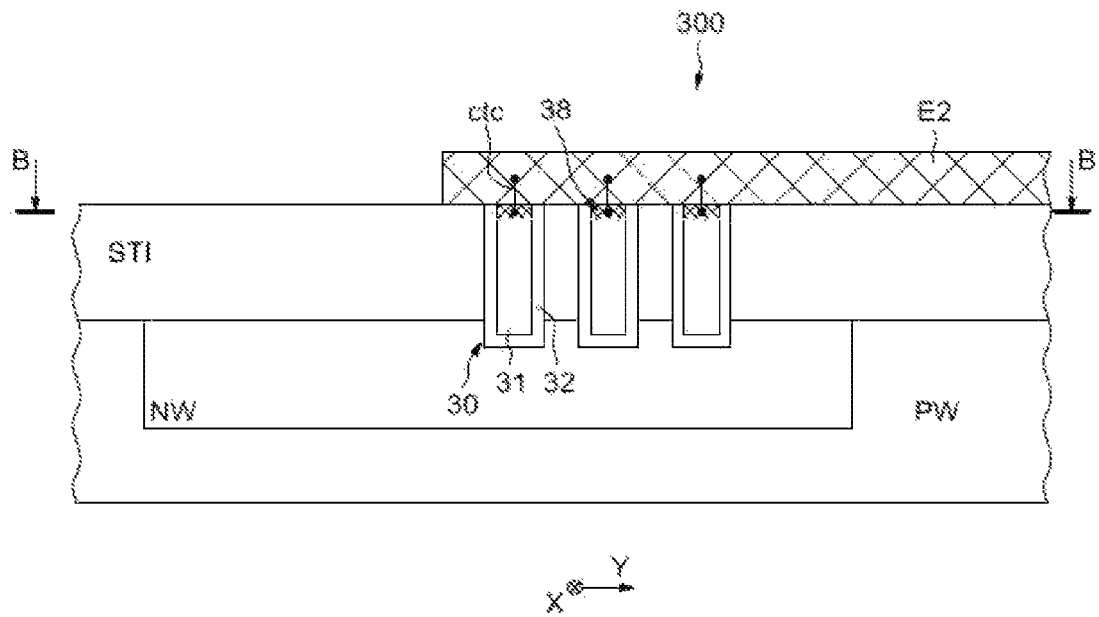

FIGS. 3A, 3B and 3C show an example of an embodiment of a filler capacitor cell 300.

FIG. 3A is a sectional view, in the plane AA of FIG. 3B, of the filler capacitor cell 300, FIG. 3B is a top view, in the plane BB of FIGS. 3A and 3C, of the filler capacitor cell 300, and FIG. 3C is a sectional view, in the plane CC of FIG. 3B, of the filler capacitor cell 300.

Figure 4A:
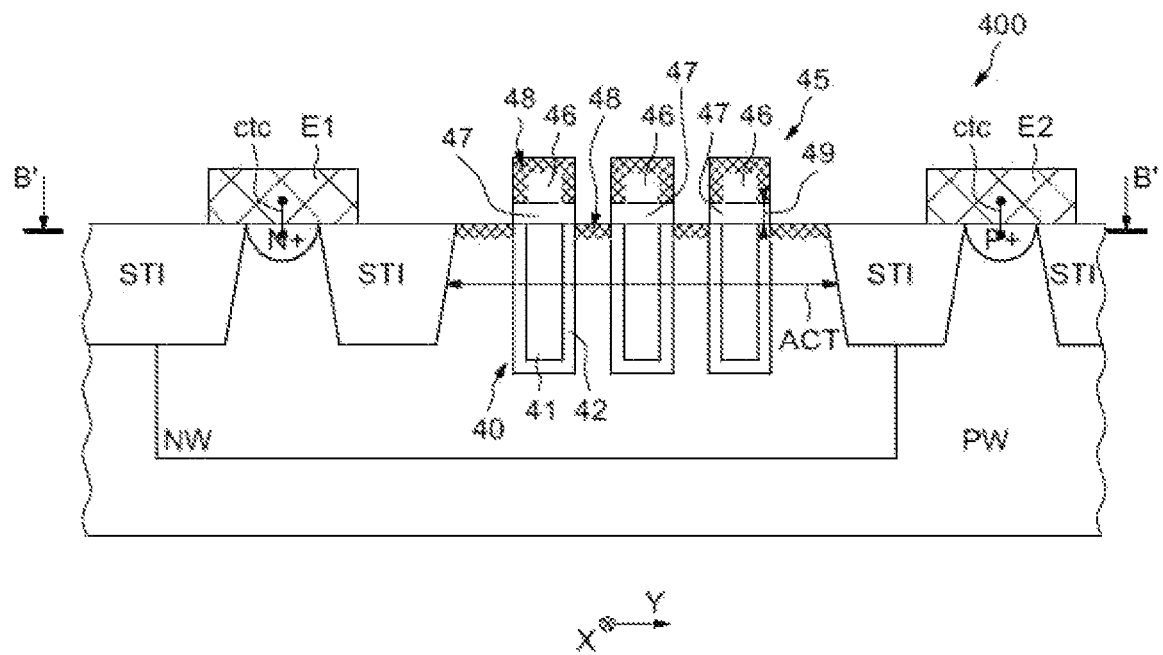
FIGS. 4A to 4C show an example of an embodiment of a filler capacitor cell.
Figure 4B:
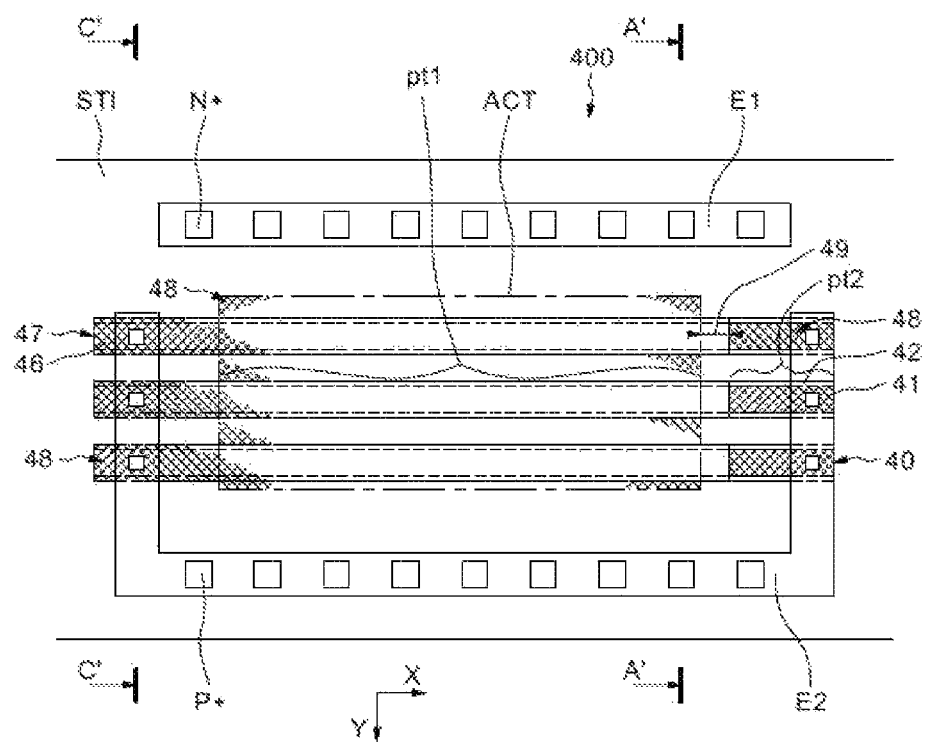
Figure 4C:
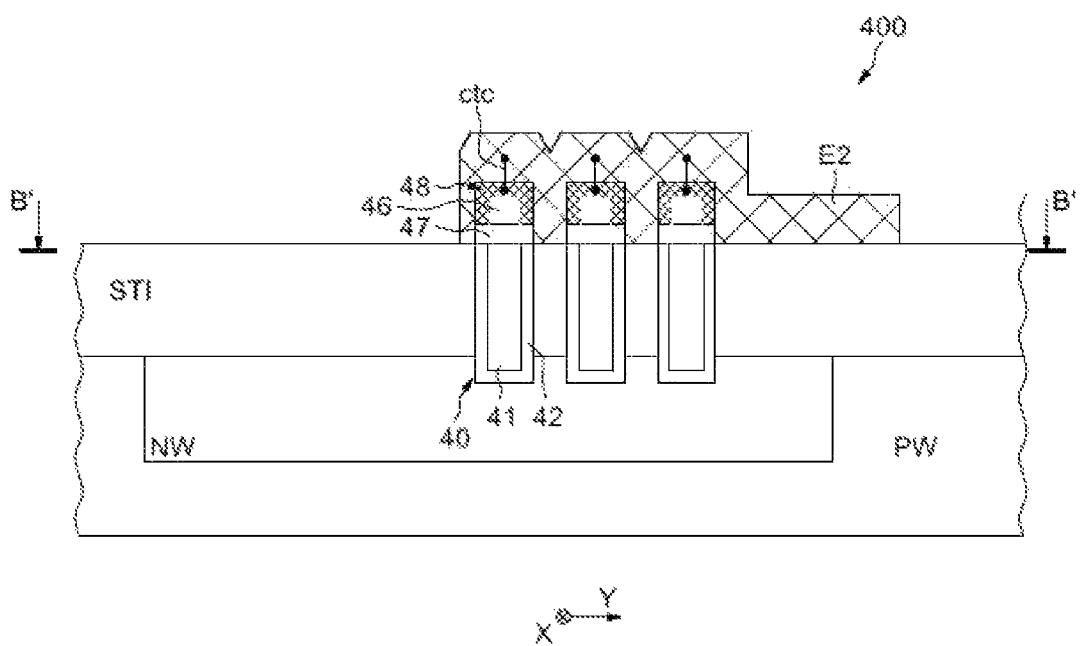

FIGS. 4A, 4B and 4C show another example of an embodiment of a filler capacitor cell 400.

FIG. 4A is a sectional view, in the plane A'A' of FIG. 4B, of the filler capacitor cell 400, FIG. 4B is a top view, in the plane B'B' of FIGS. 4A and 4C, of the filler capacitor cell 400, and FIG. 4C is a sectional view, in the plane C'C' of FIG. 4B, of the filler capacitor cell 400.

Figure 5A:
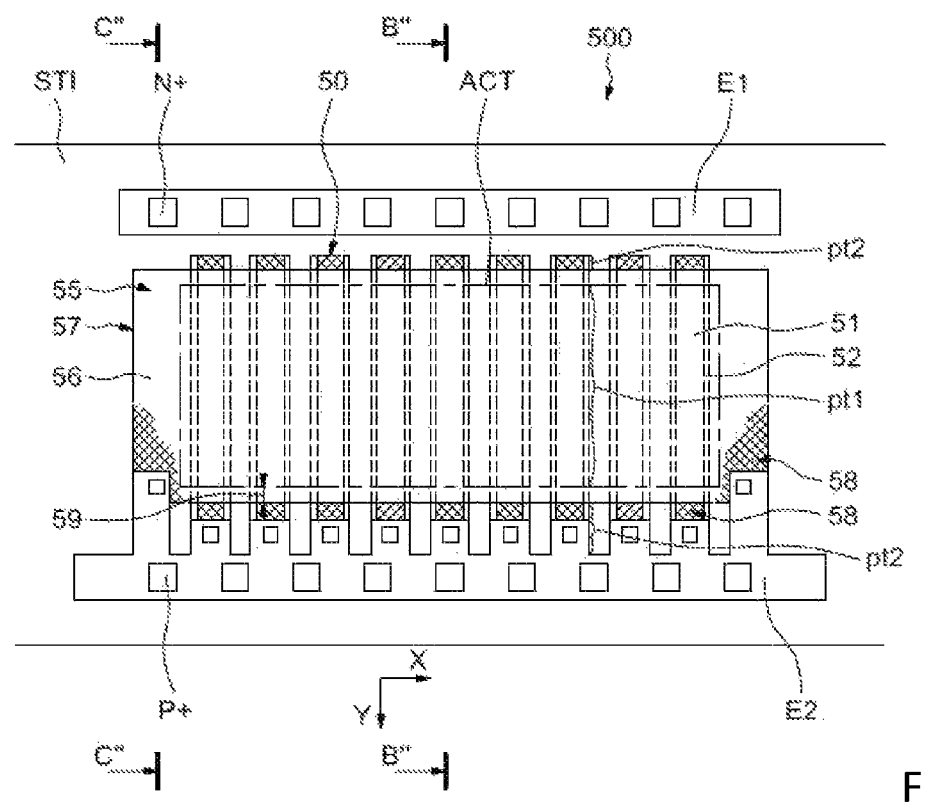
FIGS. 5A to 5C show an example of an embodiment of a filler capacitor cell.
Figure 5B:
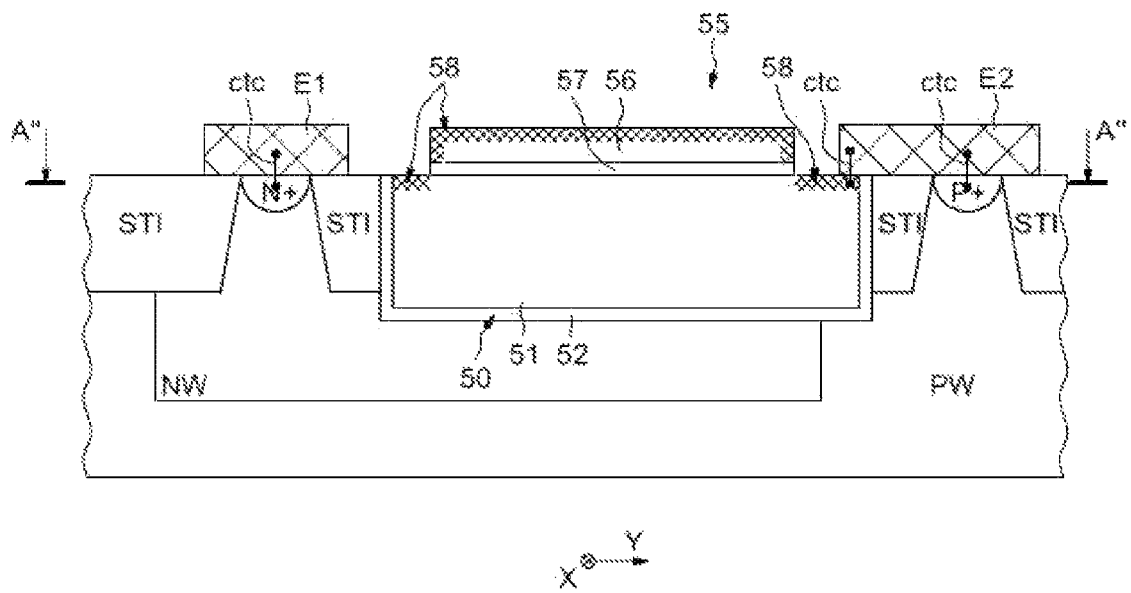
Figure 5C:
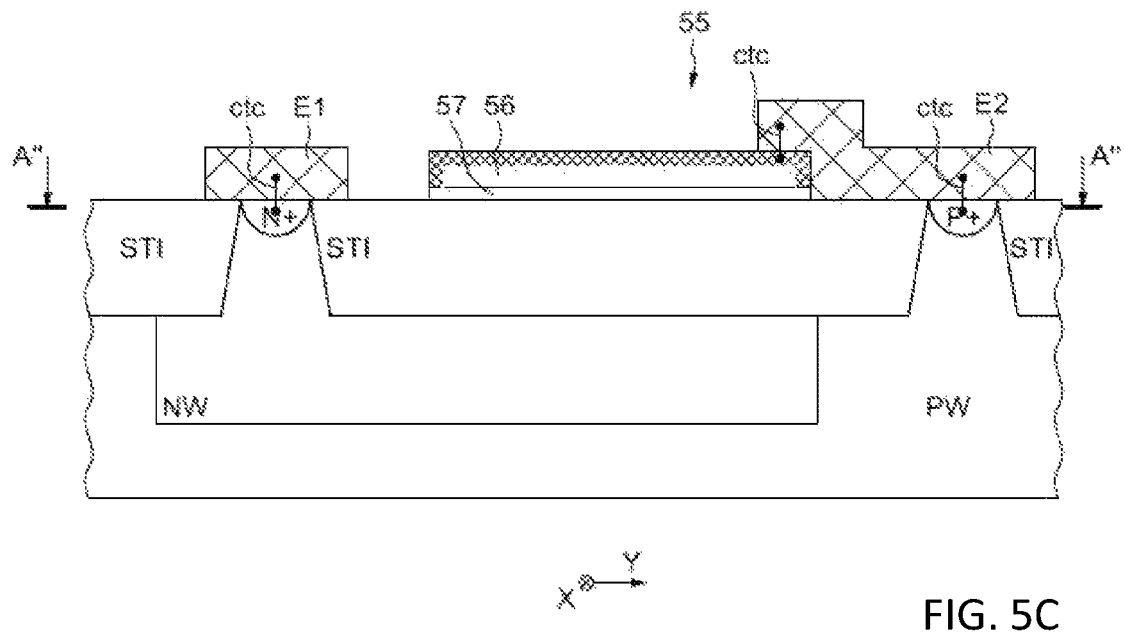

FIGS. 5A, 5B and 5C show another example of an embodiment of a filler capacitor cell 500.

FIG. 5A is a top view, in the plane A'A' of FIGS. 5B and 5C, of the filler capacitor cell 500, FIG. 5B is a sectional view, in the plane B"B" of FIG. 5A, of the filler capacitor cell 500, and FIG. 5C is a sectional view, in the plane C"C" of FIG. 5A, of the filler capacitor cell 500.

Figure 8A:
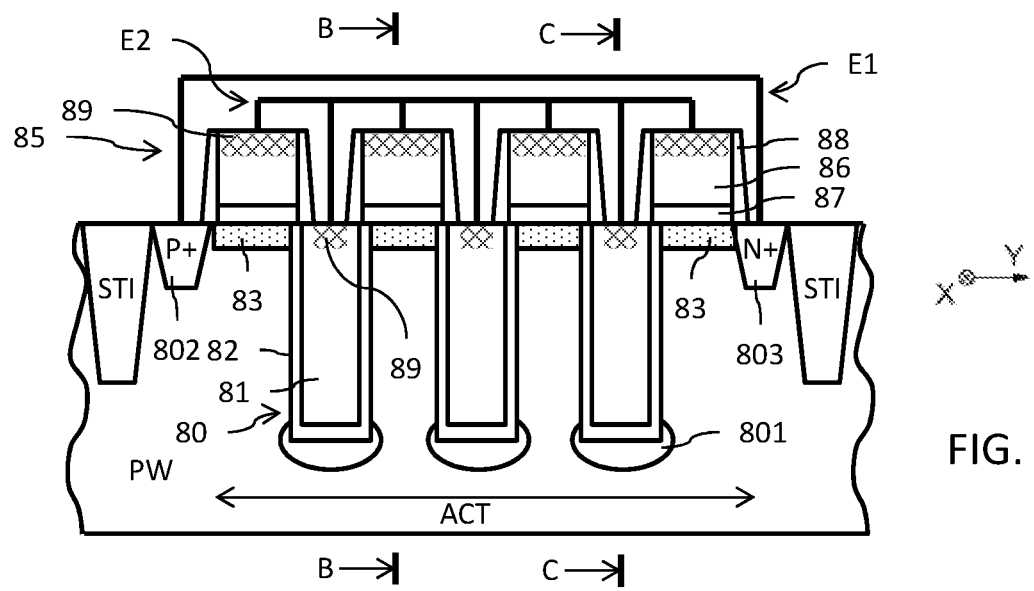
FIGS. 8A to 8C show an example of an embodiment of a filler capacitor cell.
Figure 8B:
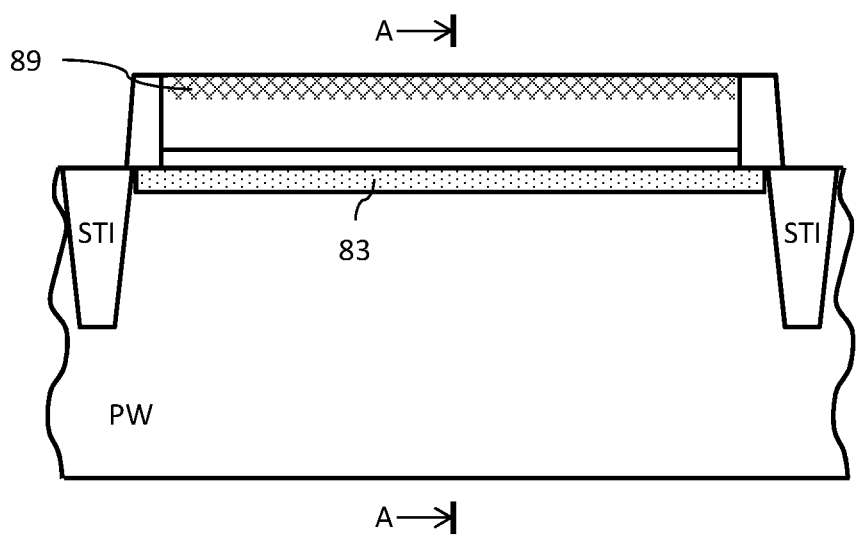
Figure 8C:
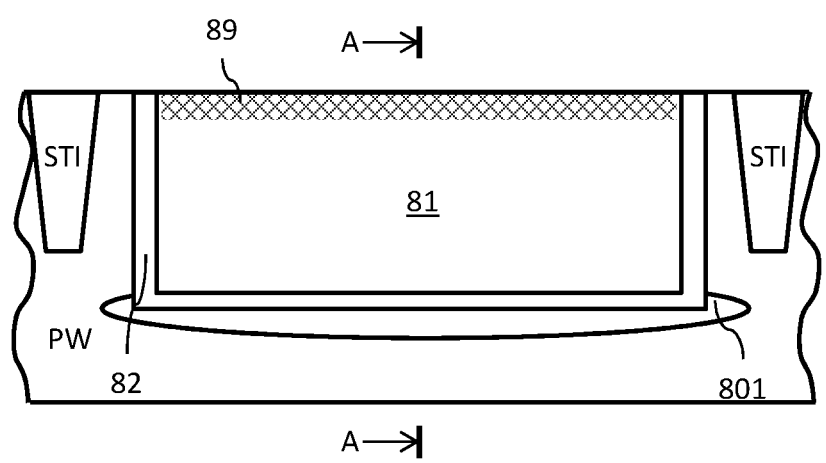

FIGS. 8A, 8B and 8C show another example of an embodiment of a filler capacitor cell 800.

FIG. 8A is a sectional view in the plane AA of FIG. 8B, of the filler capacitor cell 800, FIG. 8B is a sectional view in the plane BB of FIG. 8A, of the filler capacitor cell 800 and FIG. 8C is a sectional view in the plane CC of FIG. 8A of the filler capacitor cell 800.

Figure 9A:
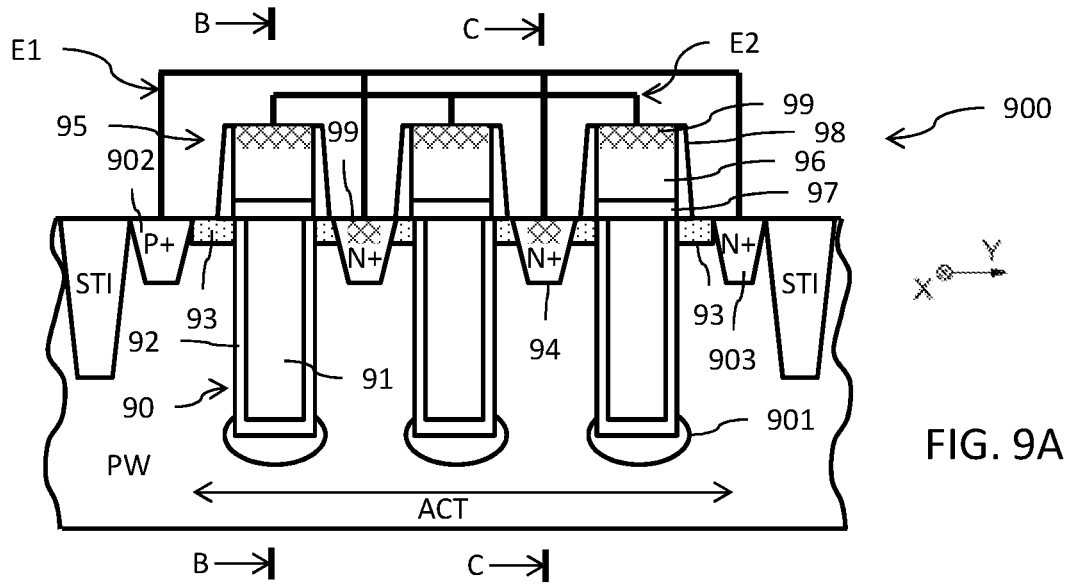
FIGS. 9A to 9C show an example of an embodiment of a filler capacitor cell.
Figure 9B:
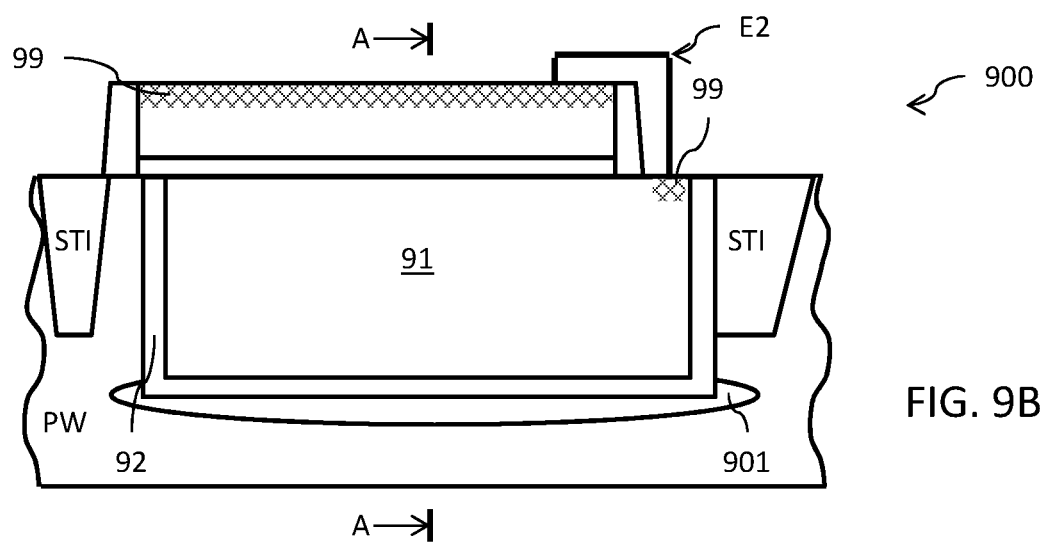
Figure 9C:
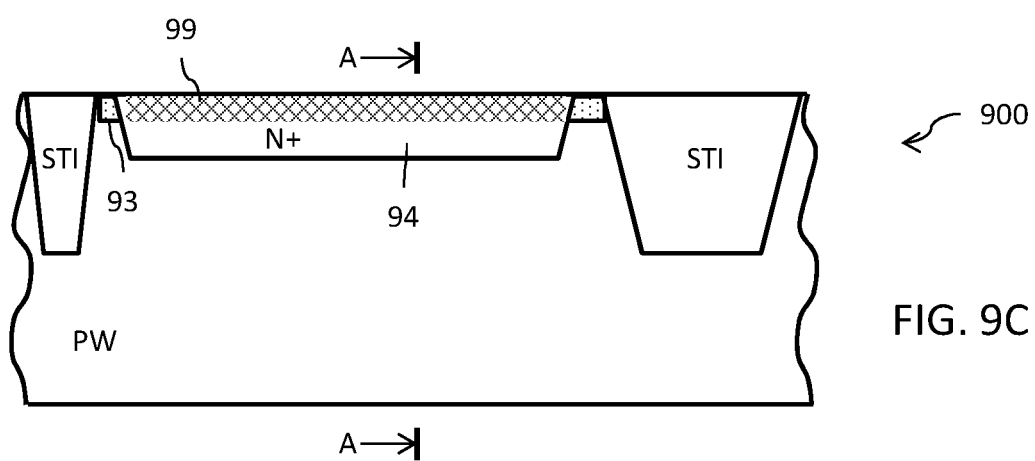

FIGS. 9A, 9B and 9C show another example of an embodiment of a filler capacitor cell 900.

FIG. 9A is a sectional view in the plane AA of FIG. 9B, of the filler capacitor cell 900, FIG. 9B is a sectional view in the plane BB of FIG. 9A, of the filler capacitor cell 900 and FIG. 9C is a sectional view in the plane CC of FIG. 9A of the filler capacitor cell 900.

Figure 10A:
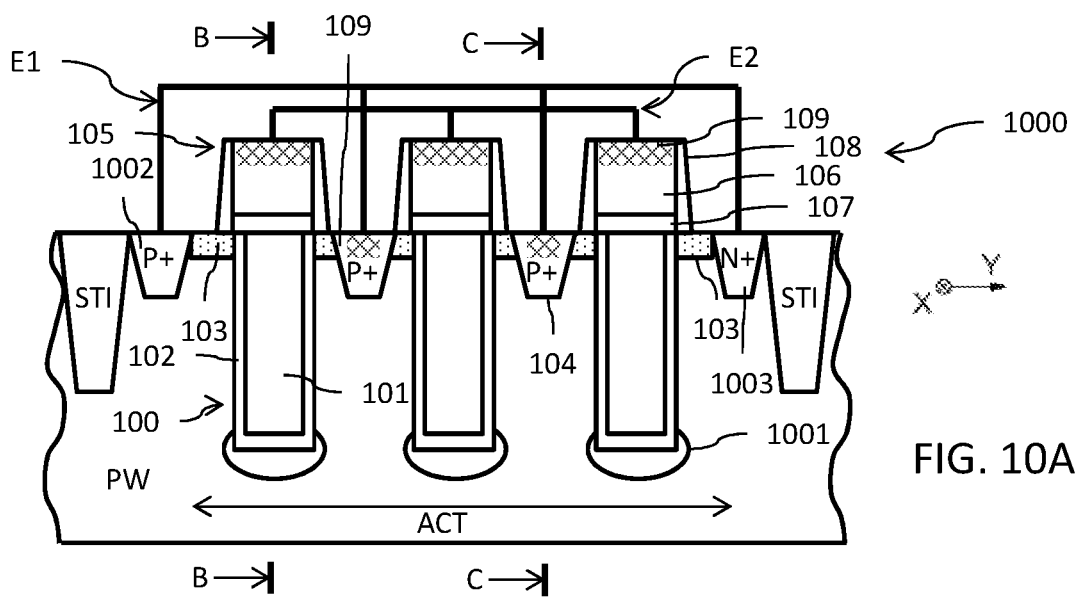
FIGS. 10A to 10C show an example of an embodiment of a filler capacitor cell.
Figure 10B:
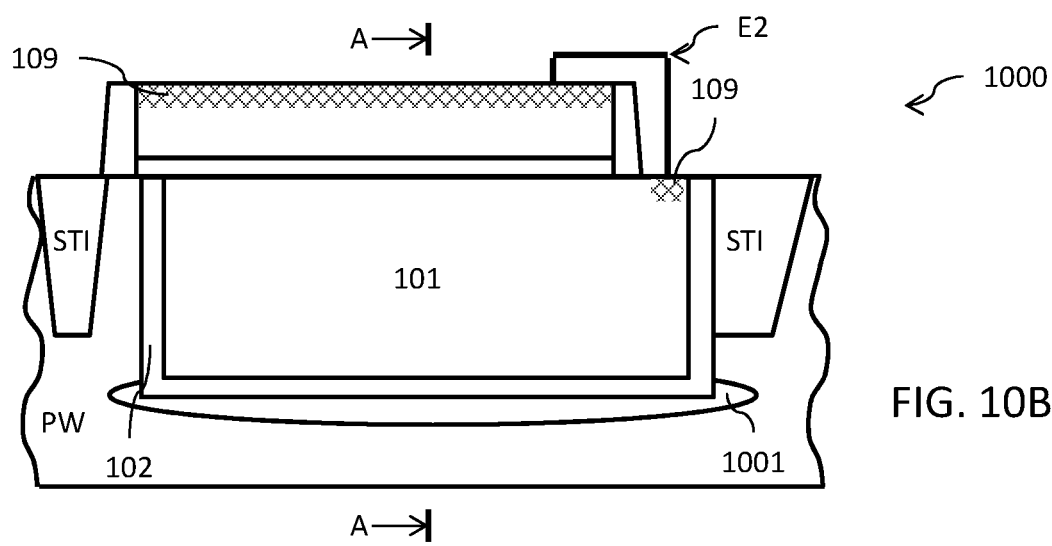
Figure 10C:
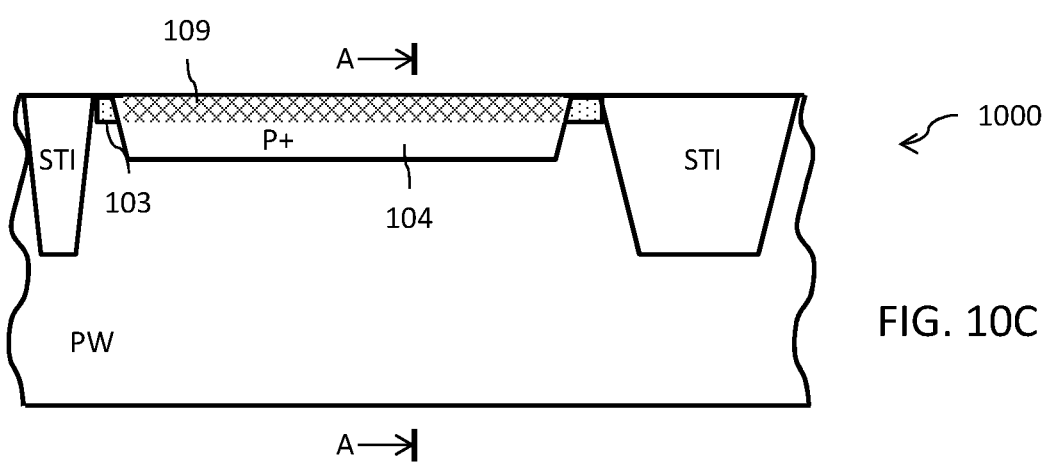

FIGS. 10A, 10B and 10C show another example of an embodiment of a filler capacitor cell 1000.

FIG. 10A is a sectional view in the plane AA of FIG. 10B, of the filler capacitor cell 1000, FIG. 10B is a sectional view in the plane BB of FIG. 10A, of the filler capacitor cell 1000 and FIG. 10C is a sectional view in the plane CC of FIG. 10A of the filler capacitor cell 1000.

For example, the filler capacitor cells 300, 400, 500, 800, 900, 1000 are located in an empty space of a logic part of an integrated circuit.

A logic part of an integrated circuit may comprise an alternating series of semiconductor wells doped with a first type of conductivity NW, such as n-type, and wells PW doped with a second type of conductivity opposed to the first type of conductivity, such as p-type. The wells PW having the second type of conductivity may be the substrate, but will be denoted by the term "well" in the following text.

The wells NW and PW may be arranged in the form of a strip running along the length of the logic part (in a direction X) and may alternate laterally with one another (in a direction Y, perpendicular to the direction X). This enables logic cells to be made by complementary technology in a standard size.

The width of a logic cell of standard size, equal to 1.26 µm for example, corresponds to the width of a pair formed by a well NW and a well PW that are laterally adjacent.

Thus, the elements manufactured in the logic part, including examples of embodiments of filler capacitor cells 300, 400, 500, 800, 900, 1000 detailed below, have a footprint of 1.26 µm in the direction X, and, for example, a footprint varying by intervals of 0.18 µm in the direction Y. Said footprints define the standard size dimensions.

FIGS. 3A, 3B and 3C show a filler capacitor cell 300 having standard size dimensions.

In the first semiconductor well NW, a working area ACT (resembling an active region of a transistor) is delimited by a frame of isolating regions, such as a local silicon oxide (LOCOS, the usual abbreviation for "LOCal Oxidation of Silicon), or preferably shallow trench isolation (STI) structures.

In other words, the working area ACT corresponds to a part of the well NW (or PW) that is not covered by shallow isolation trenches STI.

The capacitor cell 300 comprises at least one trench 30, three trenches being present in this example, housing an electrically conductive central portion 31, enclosed by an isolating enclosure 32.

Each of the trenches 30 is located at least partially in the working area ACT, and extends into the isolating region STI. In this example, the trenches 30 extend from one side of said frame to the other, in the isolating regions STI located on either side of the working area ACT. The trenches 30 extend longitudinally in the direction X.

The trenches 30 have a structure resembling that of a buried gate of a vertical transistor. The trenches 30 may, for example, be advantageously formed during manufacturing steps that are in common with the formation of vertical transistors of another part of the integrated circuit.

For example, the electrically conductive central portion 31 is formed from polycrystalline silicon and the isolating enclosure 32 is a silicon oxide having a thickness of 8 to 10 nm.

The filler capacitor cell further comprises a cover region 35.

The cover region 35 comprises an electrically conductive layer 36 resting on a dielectric layer 37.

The electrically conductive layer 36 may be formed from polycrystalline silicon, and the dielectric layer 37 may be a silicon oxide having a thickness of 1.5 to 2.5 nm. The dielectric layer 37 may also comprise a stack of oxide-nitride-silicon oxide layers (ONO). A stack of the ONO type offers better performance as regards the reduction of the leakage current.

The electrically conductive layer 36 of the cover region 35 makes it possible, notably, to increase the capacitance of the capacitor cell device 300. This is because, with a parallel capacitive element comprising the first semiconductor region NW, the dielectric layer 37 and the electrically conductive layer 36 may thus be formed optionally and at no additional cost.

The cover region 35 covers at least a first part pt1 of the surface of the trenches 30, thus forming a mask protecting the central portions 31 of a subsequent metal silicide formation, preventing the formation of short circuits between the well NW and the central portion 31.

For practical reasons, the common term "silicidation" will be used in the following text to denote a formation of metal silicide.

In this example, the cover region 35 takes the form of a plate covering the whole surface of the working area ACT.

The cover region 35 is at least aligned with the delimitation of the working area ACT, the cover region 35 possibly extending beyond the delimitation of the working area ACT.

Thus, the first part pt1 of the surface of the trenches 30 corresponds to the part located in the working area ACT.

The trenches 30 also comprise a second part pt2 which is not covered by the cover region 35.

The joining of the first part pt1 and the second part pt2 does not necessarily form the whole of the respective trench 30.

Films of metal silicide 38 formed on the surface of the exposed semiconductor areas are represented by cross-hatching.

For example, such films of metal silicide 38 may have a thickness of about 20 to 25 nm.

Thus, the central portions 31 comprise surface areas of metal silicide 38, delimited by the cover region 35, and thus located at a distance 39 from the frame of the working area ACT.

The areas of metal silicide 38 act as contacts ctc for the conductive central portions 31 of the trenches 30 and for the conductive layer 36 of the cover region 35.

Highly doped regions P+, located on the surface of the semiconductor region having the second type of conductivity PW, act as contacts ctc for said semiconductor region PW.

For example, a second electrode E2 of the filler capacitor cell 300 comprises an electrically conductive track, electrically connecting said contacts ctc of the central portions 31, of the conductive layer 36 and of the semiconductor region having the second type of conductivity PW.

Highly doped regions N+, located on the surface of the semiconductor region having the first type of conductivity NW, act as contacts ctc with an electrically conductive track included in a first electrode E1 of the filler capacitor cell 300.

The isolating enclosure 32 enclosing the conductive central portions 31 of the trenches 30 and the dielectric layer 37 of the cover region 35 jointly form the dielectric region of the capacitor cell 300.

Such an embodiment may have a capacitance of 21 fF per standard cell (that is to say, a capacitor cell measuring 2.88 μm by 1.26 μm), for a leakage current of about 3.5 μA/nF.

FIGS. 4A, 4B and 4C show another example of an embodiment of a filler capacitor cell 400 having standard size dimensions.

In this example, a working area ACT (resembling an active region of a transistor) is delimited in the well NW by a frame of isolating regions, preferably shallow isolation trenches STI.

The capacitor cell 400 comprises at least one trench 40, three trenches being present in this example, housing an electrically conductive central portion 41, enclosed by an isolating enclosure 42.

Each of the trenches 40 is located at least partially in the working area ACT, and extends into the isolating region STI. In this example, the trenches extend longitudinally in the direction X, from one side to the other of said frame.

For example, the electrically conductive central portion 41 is formed from polycrystalline silicon and the isolating enclosure 42 is a silicon oxide having a thickness of 8 to 10 nm.

The filler capacitor cell further comprises a cover region 45.

The cover region 45 comprises an electrically conductive layer 46 resting on a dielectric layer 47.

The electrically conductive layer 46 may be formed from polycrystalline silicon, and the dielectric layer 47 may be a silicon oxide having a thickness of 1.5 to 2.5 nm. The dielectric layer 47 may also comprise a stack of oxide-nitride-silicon oxide layers (ONO). A stack of the ONO type offers better performance as regards the reduction of the leakage current.

The electrically conductive layer 46 of the cover region 45 makes it possible, notably, to increase the capacitance of the capacitor cell device 400. This is because, with a parallel capacitive element comprising the first semiconductor region NW, the dielectric layer 47 and the electrically conductive layer 46 may thus be formed optionally and at no additional cost.

The cover region 45 covers at least a first part pt1 of the surface of the trenches 40, thus forming a mask protecting the central portions 41 of a subsequent metal silicidation, preventing the formation of short circuits between the well NW and the central portion 41.

In this example, the cover region 45 takes the form of strips arranged facing each trench 40 respectively.

The cover region 45 is at least aligned, in the direction of the length of the strips, with the delimitation of the working area ACT, the cover region 45 possibly extending beyond the delimitation of the working area ACT.

Similarly, the cover region 45 is at least aligned, in the direction of the width of the strips, with the delimitation of the respective central portions 41 of the trenches 40 (that is to say, with the inside of the isolating enclosure 42), the cover region 45 possibly extending beyond the delimitation of the central portions 41, being aligned for example with the outside of the isolating enclosure 42.

Thus, the first part pt1 of the surface of the trenches 40 corresponds to the part located in the working area ACT.

The trenches 40 also comprise a second part pt2 which is not covered by the cover region 45.

The joining of the first part pt1 and the second part pt2 does not necessarily form the whole of the respective trench 40.

Films of metal silicide 48 formed on the surface of the exposed semiconductor areas are represented by crosshatching.

Thus, the central portions 41 of the second parts pt2 of said trenches 40 comprise surface areas of metal silicide 48, delimited by the cover region 45, and thus located at a distance 49 from the frame of the working area ACT.

The areas of metal silicide 48 act as contacts ctc for the conductive central portions 41 of the trenches 40 and for the conductive layer 46 of the cover region 45.

Highly doped regions P+, located on the surface of the semiconductor region having the second type of conductivity PW, act as contacts ctc for said semiconductor region PW.

For example, a second electrode E2 of the filler capacitor cell 400 comprises an electrically conductive track, electrically connecting said contacts ctc of the central portions 41, of the conductive layer 46 and of the semiconductor region having the second type of conductivity PW.

Highly doped regions N+, located on the surface of the semiconductor region having the first type of conductivity NW, act as contacts ctc with an electrically conductive track included in a first electrode E1 of the filler capacitor cell 400.

Such an embodiment may have a capacitance of 15 fF per standard cell (that is to say, a capacitor cell measuring 2.88 μm by 1.26 μm), for a leakage current of about 13 nA/nF.

FIGS. 5A, 5B and 5C show another example of an embodiment of a filler capacitor cell 500 having standard size dimensions.

In this example, a working area ACT (resembling an active region of a transistor) is delimited in the well NW by a frame of isolating regions, preferably shallow isolation trenches STI.

The capacitor cell 500 comprises at least one trench 50, seven trenches being present in this example, housing an electrically conductive central portion 51, enclosed by an isolating enclosure 52.

Each of the trenches 50 is located at least partially in the working area ACT, and extends into the isolating region STI. In this example, the trenches extend laterally in the direction Y, from one side to the other of said frame.

For example, the electrically conductive central portion 51 is formed from polycrystalline silicon and the isolating enclosure 52 is a silicon oxide having a thickness of 8 to 10 nm.

The filler capacitor cell further comprises a cover region 55.

The cover region 55 comprises an electrically conductive layer 56 resting on a dielectric layer 57.

The electrically conductive layer 56 may be formed from polycrystalline silicon, and the dielectric layer 57 may be a silicon oxide having a thickness of 1.5 to 2.5 nm. The dielectric layer 57 may also comprise a stack of oxide-nitride-silicon oxide layers (ONO). A stack of the ONO type offers better performance as regards the reduction of the leakage current.

The electrically conductive layer 56 of the cover region 55 makes it possible, notably, to increase the capacitance of the capacitor cell device 500. This is because, with a parallel capacitive element comprising the first semiconductor region NW, the dielectric layer 57 and the electrically conductive layer 56 may thus be formed optionally and at no additional cost.

The cover region 55 covers at least a first part pt1 of the surface of the trenches 50, thus forming a mask protecting the central portions 51 of a subsequent metal silicidation, preventing the formation of short circuits between the well NW and the central portion 51.

In this example, the cover region 55 takes the form of a plate covering the whole surface of the working area ACT.

The cover region 55 is at least aligned with the delimitation of the working area ACT, the cover region 55 possibly extending beyond the delimitation of the working area ACT.

Thus, the first part pt1 of the surface of the trenches 50 corresponds to the part located in the working area ACT.

The trenches 50 also comprise a second part pt2 which is not covered by the cover region 55.

The joining of the first part pt1 and the second part pt2 does not necessarily form the whole of the respective trench 50.

Films of metal silicide 58 formed on the surface of the exposed semiconductor areas are represented by crosshatching.

Thus, the central portions 51 of the second parts pt2 of said trenches 50 comprise surface areas of metal silicide 58, delimited by the cover region 55, and thus located at a distance 59 from the frame of the working area ACT.

The areas of metal silicide 58 act as contacts ctc for the conductive central portions 51 of the trenches 50 and for the conductive layer 56 of the cover region 55.

Highly doped regions P+, located on the surface of the semiconductor region having the second type of conductivity PW, act as contacts ctc for said semiconductor region PW.

For example, a second electrode E2 of the filler capacitor cell 500 comprises an electrically conductive track, electrically connecting said contacts ctc of the central portions 51, of the conductive layer 56 and of the semiconductor region having the second type of conductivity PW.

Highly doped regions N+, located on the surface of the semiconductor region having the first type of conductivity NW, act as contacts ctc with an electrically conductive track included in a first electrode E1 of the filler capacitor cell 500.

Such an embodiment may have a capacitance of 15 fF per standard cell (that is to say, a capacitor cell measuring 2.88 μm by 1.26 μm), for a leakage current of zero.

FIGS. 8A, 8B and 8C show another example of an embodiment of a filler capacitor cell 800 having standard size dimensions.

In this example, a working area ACT (resembling an active region of a transistor) is delimited in the semiconductor well PW by a frame of isolating regions, preferably shallow isolation trenches STI.

The capacitor cell 800 comprises at least one trench 80, three trenches being present in this example, each trench 80 housing an electrically conductive central portion 81, enclosed by an isolating enclosure 82. The semiconductor well PW may be doped to form a region 801 at the bottom of each trench 80. The region 801 may, for example, be doped opposite the dopant of the semiconductor well, in this instance, with N type dopant.

Each of the trenches 80 is located at least partially in the working area ACT, and may extend into the isolating region STI. In this example, the trenches extend longitudinally in the direction X, from one side to the other side of said frame.

The trenches 80 have a structure resembling that of a buried gate of a vertical transistor. The trenches 80 may, for example, be advantageously formed during manufacturing steps that are in common with the formation of vertical transistors of another part of the integrated circuit.

For example, the electrically conductive central portion 81 is formed from polycrystalline silicon and the isolating enclosure 82 is a silicon oxide having a thickness of 8 to 10 nm.

The filler capacitor cell 800 further comprises a cover region 85.

The cover region 85 comprises an electrically conductive layer 86 resting on a dielectric layer 87 and laterally surrounded by an insulating sidewall spacer 88.

The electrically conductive layer 86 may be formed from polycrystalline silicon, and the dielectric layer 87 may be a silicon oxide having a thickness of 1.5 to 2.5 nm. The dielectric layer 87 may also comprise a stack of oxide-nitride-silicon oxide layers (ONO). A stack of the ONO type offers better performance as regards the reduction of the leakage current. The sidewall spacer 88 may be formed of a suitable insulating material such as an oxide and/or nitride and may be made of one or more layers.

The electrically conductive layer 86 of the cover region 85 makes it possible, notably, to increase the capacitance of the capacitor cell device 800. This is because, with a parallel capacitive element comprising the semiconductor well PW, the dielectric layer 87 and the electrically conductive layer 86 may thus be formed optionally and at no additional cost.

In this example, the cover region 85 takes the form of strips arranged facing portions of the semiconductor well PW positioned between adjacent trenches 80. In this context, a longitudinal center of each strip of the cover region 85 is substantially aligned with a longitudinal center between adjacent trenches 80. The strips of the cover region 85 longitudinally extend parallel to the trenches 80. The sidewall spacer 88 delimits the sides and ends of each strip of the cover region 85.

The cover region 85 is at least aligned, in the longitudinal direction of the length of the strips, with the delimitation of the working area ACT, the cover region 85 possibly extending beyond the delimitation of the working area ACT.

Similarly, the cover region 85 is at least aligned, in the lateral direction of the width of the strips, with the delimitation of the portion of the semiconductor well PW positioned between adjacent trenches 80 and extending beyond the delimitation of the portion of the semiconductor well PW positioned between adjacent trenches 80 to extend partially over the adjacent trenches 80. In particular, while the width of the electrically conductive layer 96 and the dielectric layer 97 may correspond to the width of the portion of the semiconductor well PW positioned between adjacent trenches 80, the width of the overall strip is defined by the presence of the sidewall spacer 98 which will result in the strips extending laterally at least partially over each of the adjacent trenches 80 (and more specifically, partially over the respective central portions 91 of those adjacent trenches 90; for example, extending over a side part of the electrically conductive central portion of the trench).

The cover region 85 accordingly covers the portions of the semiconductor well PW positioned between adjacent trenches 80, the upper surface of the isolating enclosure 82 for those trenches 80 and a part (along the lateral sides) of the upper surface of the central portions 91 of those adjacent trenches 90, thus forming a mask protecting the upper surface of the semiconductor well PW as well as the covered lateral side parts of the central portions 91 during a subsequent metal silicidation.

Films of metal silicide 89 formed on the surface of the exposed semiconductor areas are represented by cross-hatching.

Thus, the central portions 81 of the trenches 80 comprise surface areas of metal silicide 89, delimited by the cover region 85. The conductive layer 86 of the cover region 85 also comprises surface areas of metal silicide 89. In particular, the surface areas of metal silicide 89 are formed in a part of the electrically conductive central portion of the trench which is not covered by the sidewall spacer.

The areas of metal silicide 89 act as contacts for the conductive central portions 81 of the trenches 80 and for the conductive layer 86 of the cover region 85.

Highly P+ doped regions 802, located on the surface of the semiconductor well PW act as contacts for said semiconductor well PW. These P+ regions may also comprise surface areas of metal silicide (not explicitly shown).

Highly N+ doped regions 803, located on the surface of the semiconductor well PW act as contacts with a doped surface region 83 at the upper surface of the semiconductor well PW. This doped surface region 83 may, for example, comprise an N type (for example, Arsenic (As)) surface implant, and forms a counter-implant layer (or auxiliary semiconductor layer) providing a source of minority carriers. These N+ regions 803 may also comprise surface areas of metal silicide (not explicitly shown). This doped surface region 83 is located underneath the strips of the cover region 85.

The filler capacitor cell 800 includes a first electrode E1 formed by the electrical connection of the highly P+ doped region 802 and the highly N+ doped region 803. The filler capacitor cell 800 further includes a second electrode E2 formed by the electrical connection of the central portions 81 of said trenches 80 and the electrically conductive layer 86 of the cover region 85.

While the embodiment of capacitor 800 shown is implemented in the semiconductor well PW, it will be understood that the embodiment may instead be implemented in the semiconductor well NW if desired.

The filler capacitor cell 800 addresses a particular concern with trench capacitor structures relating to cut frequency. Access resistance with respect to making electrical contact to the polysilicon and semiconductor structures forming the capacitor electrodes can be high. This concern with access resistance is, in particular, noted with respect to making electrical contact to the polysilicon structure within each trench. The filler capacitor cell 800 exhibits a reduction in trench access resistance and corresponding improvement in cut frequency response.

For example, for the filler capacitor cell 800, the placement of the cover region 85 over portions of the semiconductor well PW positioned between adjacent trenches 80, and the provision of sidewall spacers 88 permits silicide 89 formation longitudinally along the length of the electrically conductive central portion 81 of each trench 80 supports improved and lower resistance electrical contact. The sidewall spacers 88 further ensures that the formed silicide 89 does not produce a short circuit between the electrically conductive central portion 81 and the semiconductor well PW.

FIGS. 9A, 9B and 9C show another example of an embodiment of a filler capacitor cell 900 having standard size dimensions.

In this example, a working area ACT (resembling an active region of a transistor) is delimited in the semiconductor well PW by a frame of isolating regions, preferably shallow isolation trenches STI.

The capacitor cell 900 comprises at least one trench 90, three trenches being present in this example, each trench 90 housing an electrically conductive central portion 91, enclosed by an isolating enclosure 92. The semiconductor well PW may be doped to form a buried doped region 901 at the bottom of each trench 90. The region 901 may, for example, be doped opposite the dopant of the semiconductor well, in this instance, with N type dopant.

Each of the trenches 90 is located at least partially in the working area ACT, and extends into the isolating region STI (see, FIG. 9B, right hand side). In this example, the trenches extend longitudinally in the direction X, from one side to the other side of said frame.

The trenches 90 have a structure resembling that of a buried gate of a vertical transistor. The trenches 90 may, for example, be advantageously formed during manufacturing steps that are in common with the formation of vertical transistors of another part of the integrated circuit.

For example, the electrically conductive central portion 91 is formed from polycrystalline silicon and the isolating enclosure 92 is a silicon oxide having a thickness of 8 to 10 nm.

The filler capacitor cell 900 further comprises a cover region 95.

The cover region 95 comprises an electrically conductive layer 96 resting on a dielectric layer 97 and laterally surrounded by an insulating sidewall spacer 98.

The electrically conductive layer 96 may be formed from polycrystalline silicon, and the dielectric layer 97 may be a silicon oxide having a thickness of 1.5 to 2.5 nm. The dielectric layer 97 may also comprise a stack of oxide-nitride-silicon oxide layers (ONO). A stack of the ONO type offers better performance as regards the reduction of the leakage current. The sidewall spacer 98 may be formed of a suitable insulating material such as an oxide and/or nitride and may be made of one or more layers.

The electrically conductive layer 96 of the cover region 95 makes it possible, notably, to increase the capacitance of the capacitor cell device 900. This is because, with a parallel capacitive element comprising the semiconductor well PW, the dielectric layer 97 and the electrically conductive layer 96 may thus be formed optionally and at no additional cost.

In this example, the cover region 95 takes the form of strips arranged facing each trench 90 respectively. In this context, a longitudinal center of each strip of the cover region 95 is substantially aligned (within manufacturing tolerances) with a longitudinal center of its corresponding trench 90. The strips of the cover region 95 longitudinally extend parallel to the trenches 90. The sidewall spacer 98 delimits the sides and ends of each strip of the cover region 95.

The cover region 95 is at least aligned, in the longitudinal direction of the length of the strips, with the delimitation of the working area ACT, the cover region 95 possibly extending beyond the delimitation of the working area ACT.

Similarly, the cover region 95 is at least aligned, in the lateral direction of the width of the strips, with the delimitation of the respective central portions 91 of the trenches 90 and extending beyond the delimitation of the central portions 91 and the isolating enclosure 92 to extend partially over the semiconductor well PW positioned between adjacent trenches 90. In particular, while the width of the electrically conductive layer 96 and the dielectric layer 97 may correspond to the width of the trench 90, the width of the overall strip is defined by the presence of the sidewall spacer 98 which will result in the strips extending laterally beyond the trench 90 and at least partially over the semiconductor region PW positioned between adjacent trenches 90. More specifically, the sidewall spacer 98 extends over a side part of a portion of the semiconductor well located between trenches 90.

At the surface of the semiconductor well PW between adjacent trenches 90 and delimited by the sidewall spacers 98, highly N+ doped regions 94 are formed by a dopant implantation that uses the cover region 95 as an implantation mask. When the capacitor 900 is used in inversion mode, the highly N+ doped regions 94 provide for reduced access resistance to the channel region in the semiconductor well PW.

The cover region 95 accordingly covers the upper surface of the trenches 90, along with a portion of the semiconductor well PW positioned between adjacent trenches 90, thus forming a mask protecting the central portions 91 as well as the covered portions of the semiconductor well PW during a subsequent metal silicidation.

The trenches 90 also comprise a part which is not covered by the cover region 95 as shown in FIG. 9B. This part may, for example, be located in the area where the trenches 90 extend from the working area ACT and into the frame of isolating regions formed by the shallow isolation trenches STI.

Films of metal silicide 99 formed on the surface of the exposed semiconductor areas are represented by cross-hatching.

Thus, the central portions 91 of the ends of said trenches 90 comprise surface areas of metal silicide 99, delimited by the cover region 95. The conductive layer 96 of the cover region 95 also comprises surface areas of metal silicide 99. Furthermore, the highly N+ doped regions 94 comprise surface areas of metal silicide 99, delimited by the cover region 95. For example, the metal silicide 99 is located on a portion of the well, corresponding to at least a central part of the highly N+ doped regions 94, between the pair of trenches which is not covered by the sidewall spacer.

The areas of metal silicide 99 act as contacts for the conductive central portions 91 of the trenches 90 and for the conductive layer 96 of the cover region 95 and further for the highly N+ doped regions 94 in the portion of the semiconductor well PW positioned between adjacent trenches 90.

Highly P+ doped regions 902, located on the surface of the semiconductor well PW act as contacts for said semiconductor well PW. These P+ regions may also comprise surface areas of metal silicide (not explicitly shown).

Highly N+ doped regions 903, located on the surface of the semiconductor well PW act as contacts with a doped surface region 93 at the upper surface of the semiconductor well PW. This doped surface region 93 may, for example, comprise an N type (for example, Arsenic (As)) surface implant, and forms a counter-implant layer (or auxiliary semiconductor layer) providing a source of minority carriers. The doped regions 94 extend through the doped surface region 93 into the semiconductor well PW. These N+ regions 903 may also comprise surface areas of metal silicide (not explicitly shown). It will be noted that the regions 903 and the regions 94 may be simultaneously made using a same dopant implantation process.

The filler capacitor cell 900 includes a first electrode E1 formed by the electrical connection of the highly P+ doped region 902, the highly N+ doped region 903 and the highly N+ doped regions 94. The filler capacitor cell 900 further includes a second electrode E2 formed by the electrical connection of the central portions 91 of said trenches 90 and the electrically conductive layer 96 of the cover region 95.

While the embodiment of capacitor 900 shown is implemented in the semiconductor well PW, it will be understood that the embodiment may instead be implemented in the semiconductor well NW if desired.

FIGS. 10A, 10B and 10C show another example of an embodiment of a filler capacitor cell 1000 having standard size dimensions.

In this example, a working area ACT (resembling an active region of a transistor) is delimited in the semiconductor well PW by a frame of isolating regions, preferably shallow isolation trenches STI.

The capacitor cell 1000 comprises at least one trench 100, three trenches being present in this example, each trench 100 housing an electrically conductive central portion 101, enclosed by an isolating enclosure 102. The semiconductor well PW may be doped to form a buried doped region 1001 at the bottom of each trench 100. The region 1001 may, for example, be doped opposite the dopant of the semiconductor well, in this instance, with N type dopant.

Each of the trenches 100 is located at least partially in the working area ACT, and extends into the isolating region STI (see, FIGS. 10B, right hand side). In this example, the trenches extend longitudinally in the direction X, from one side to the other side of said frame.

The trenches 100 have a structure resembling that of a buried gate of a vertical transistor. The trenches 100 may, for example, be advantageously formed during manufacturing steps that are in common with the formation of vertical transistors of another part of the integrated circuit.

For example, the electrically conductive central portion 101 is formed from polycrystalline silicon and the isolating enclosure 102 is a silicon oxide having a thickness of 8 to 10 nm.

The filler capacitor cell 1000 further comprises a cover region 105.

The cover region 105 comprises an electrically conductive layer 106 resting on a dielectric layer 107 and laterally surrounded by an insulating sidewall spacer 108.

The electrically conductive layer 106 may be formed from polycrystalline silicon, and the dielectric layer 107 may be a silicon oxide having a thickness of 1.5 to 2.5 nm. The dielectric layer 107 may also comprise a stack of oxide-nitride-silicon oxide layers (ONO). A stack of the ONO type offers better performance as regards the reduction of the leakage current. The sidewall spacer 108 may be formed of a suitable insulating material such as an oxide and/or nitride and may be made of one or more layers.

The electrically conductive layer 106 of the cover region 105 makes it possible, notably, to increase the capacitance of the capacitor cell device 1000. This is because, with a parallel capacitive element comprising the semiconductor well PW, the dielectric layer 107 and the electrically conductive layer 106 may thus be formed optionally and at no additional cost.

In this example, the cover region 105 takes the form of strips arranged facing each trench 100 respectively. In this context, a longitudinal center of each strip of the cover region 105 is substantially aligned (within manufacturing tolerances) with a longitudinal center of its corresponding trench 100. The strips of the cover region 105 longitudinally extend parallel to the trenches 100. The sidewall spacer 108 delimits the sides and ends of each strip of the cover region 105.

The cover region 105 is at least aligned, in the longitudinal direction of the length of the strips, with the delimitation of the working area ACT, the cover region 105 possibly extending beyond the delimitation of the working area ACT.

Similarly, the cover region 105 is at least aligned, in the lateral direction of the width of the strips, with the delimitation of the respective central portions 101 of the trenches 100 and extending beyond the delimitation of the central portions 101 and the isolating enclosure 102 to extend partially over the semiconductor well PW positioned between adjacent trenches 100. In particular, while the width of the electrically conductive layer 106 and the dielectric layer 107 may correspond to the width of the trench 100, the width of the overall strip is defined by the presence of the sidewall spacer 108 which will result in the strips extending laterally beyond the trench 100 and at least partially over the semiconductor region PW positioned between adjacent trenches 100.

At the surface of the semiconductor well PW between adjacent trenches 100 and delimited by the sidewall spacers 108, highly P+ doped regions 104 are formed by a dopant implantation that uses the cover region 105 as an implantation mask. When the capacitor 1000 is used in accumulation mode, the highly P+ doped regions 104 provide for reduced access resistance to the semiconductor well PW.

The cover region 105 accordingly covers the upper surface of the trenches 100, along with a portion of the semiconductor well PW positioned between adjacent trenches 100, thus forming a mask protecting the central portions 101 as well as the covered portions of the semiconductor well PW during a subsequent metal silicidation.

The trenches 100 also comprise a part which is not covered by the cover region 105 as shown in FIG. 10B. This part may, for example, be located in the area where the trenches 100 extend from the working area ACT and into the frame of isolating regions formed by the shallow isolation trenches STI.

Films of metal silicide 109 formed on the surface of the exposed semiconductor areas are represented by cross-hatching.

Thus, the central portions 101 of the ends of said trenches 100 comprise surface areas of metal silicide 109, delimited by the cover region 105. The conductive layer 106 of the cover region 105 also comprises surface areas of metal silicide 109. Furthermore, the highly P+ doped regions 104 comprise surface areas of metal silicide 109, delimited by the cover region 105.

The areas of metal silicide 109 act as contacts for the conductive central portions 101 of the trenches 100 and for the conductive layer 106 of the cover region 105 and further for the highly P+ doped regions 104 in the portion of the semiconductor well PW positioned between adjacent trenches 100.

Highly doped P+ regions 1002, located on the surface of the semiconductor well PW act as contacts for said semiconductor well PW. These P+ regions may also comprise surface areas of metal silicide (not explicitly shown). It will be noted that the regions 1002 and the regions 104 may be simultaneously made using a same dopant implantation process.

Highly N+ doped regions 1003, located on the surface of the semiconductor well PW act as contacts with a doped surface region 103 at the upper surface of the semiconductor well PW. This doped surface region 103 may, for example, comprise an N type (for example, Arsenic (As)) surface implant, and forms a counter-implant layer (or auxiliary semiconductor layer) providing a source of minority carriers. The doped regions 104 extend through the doped surface region 103 into the semiconductor well PW. These N+ regions 1003 may also comprise surface areas of metal silicide (not explicitly shown).

The filler capacitor cell 1000 includes a first electrode E1 formed by the electrical connection of the highly P+ doped region 1002, the highly N+ doped region 1003 and the highly P+ doped regions 104. The filler capacitor cell 1000 further includes a second electrode E2 formed by the electrical connection of the central portions 101 of said trenches 100 and the electrically conductive layer 106 of the cover region 105.

While the embodiment of capacitor 1000 shown is implemented in the semiconductor well PW, it will be understood that the embodiment may instead be implemented in the semiconductor well NW if desired.

The filler capacitor cells 900 and 1000 addresses a particular concern with trench capacitor structures relating to cut frequency. Access resistance with respect to making electrical contact to the polysilicon and semiconductor structures forming the capacitor electrodes can be high. This concern with access resistance is, in particular, noted with respect to making electrical contact to the semiconductor well. The filler capacitor cells 900 and 1000 exhibit a reduction in well access resistance and corresponding improvement in cut frequency response.

For example, for the filler capacitor cell 900, the placement of the cover region 95 over the trenches 90, and the provision of sidewall spacers 98 permits silicide 99 formation longitudinally along the length of the portions of the semiconductor well PW between adjacent pairs of trenches 90 and supports improved and lower resistance electrical contact. The sidewall spacers 98 further ensure that the formed silicide 99 does not produce a short circuit between the electrically conductive central portion 91 and the semiconductor well PW. The N+ doped regions 94 provide contact to both the semiconductor well PW and the doped surface region 93 along the longitudinal length of the portions of the semiconductor well PW between adjacent pairs of trenches 90, and the N+ doped regions 94 also support efficient operation of the capacitor 1000 when operating in inversion mode.

Furthermore, for the filler capacitor cell 1000, the placement of the cover region 105 over the trenches 100, and the provision of sidewall spacers 108 permits silicide 109 formation longitudinally along the length of the portions of the semiconductor well PW between adjacent pairs of trenches 100 and supports improved and lower resistance electrical contact. The sidewall spacers 108 further ensure that the formed silicide 109 does not produce a short circuit between the electrically conductive central portion 101 and the semiconductor well PW. The P+ doped regions 104 provide contact to both the semiconductor well PW and the doped surface region 103 along the longitudinal length of the portions of the semiconductor well PW between adjacent pairs of trenches 90, and the P+ doped regions 104 also support efficient operation of the capacitor 1000 when operating in accumulation mode.

FIGS. 7A to 7F show results of steps of examples of application of a method of manufacturing filler capacitor cells, for example, the cells 300, 400, 500.

This method is suitable for manufacturing filler capacitor cells in empty spaces of a logic circuit LG, comprising a first semiconductor region NW having a first type of conductivity, for example n-type conductivity, formed in a semiconductor substrate PW having a second type of conductivity opposed to the first type of conductivity, for example p-type conductivity.

Figure 7A:
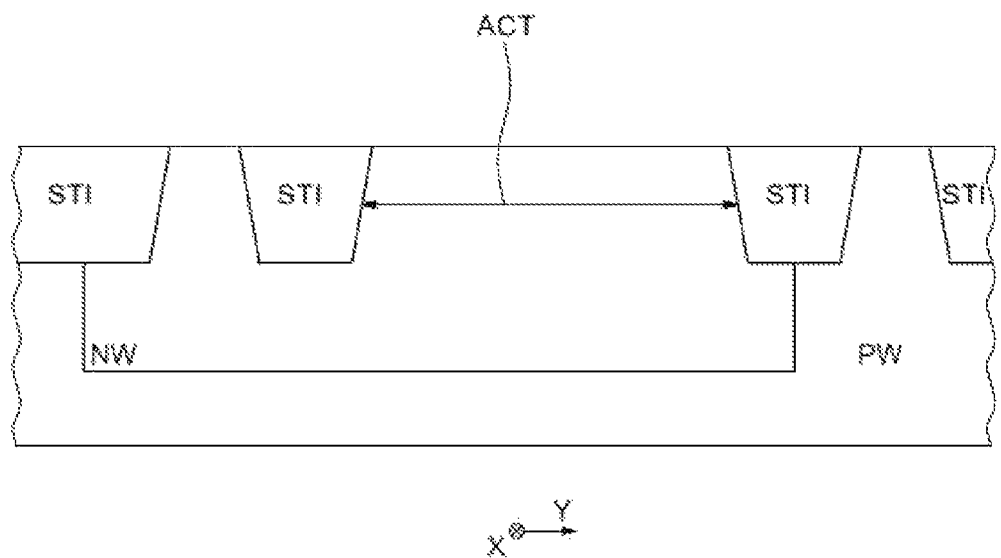
FIGS. 7A to 7F show steps of a method of manufacturing a filler capacitor cell.

FIG. 7A shows the result of a step of forming shallow isolation trenches STI which delimit, notably, a working area ACT in the first semiconductor region NW. The working area ACT corresponds to a part of the first semiconductor region NW that is not covered by shallow isolation trenches STI. The working area ACT is thus framed by isolating regions, in this example shallow isolation trenches STI.

Figure 7B:
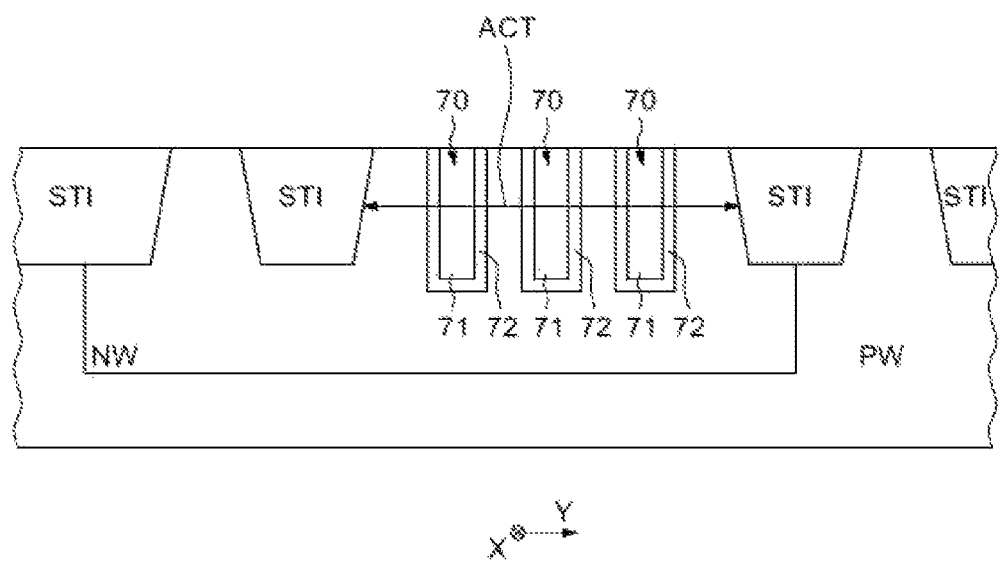

FIG. 7B shows the result of a step of forming at least one trench 70, housing an electrically conductive central portion 71, enclosed by an isolating enclosure 72. Said at least one trench 70 is formed, at least partially, in the working area ACT.

The formation of said at least one trench 70 comprises anisotropic etching, such as reactive ion etching (commonly abbreviated to as RIE), formation of an oxide by a process such as deposition or growth on the sides of the trenches thus etched, formation of the isolating enclosure 72, and damascene deposition of a conductive material to form the central portion 71.

Figure 7C:
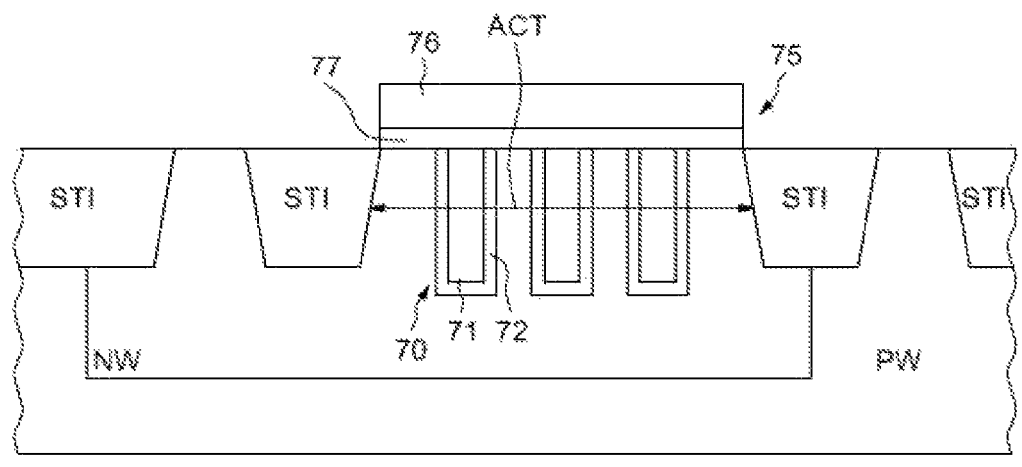
Figure 7E:
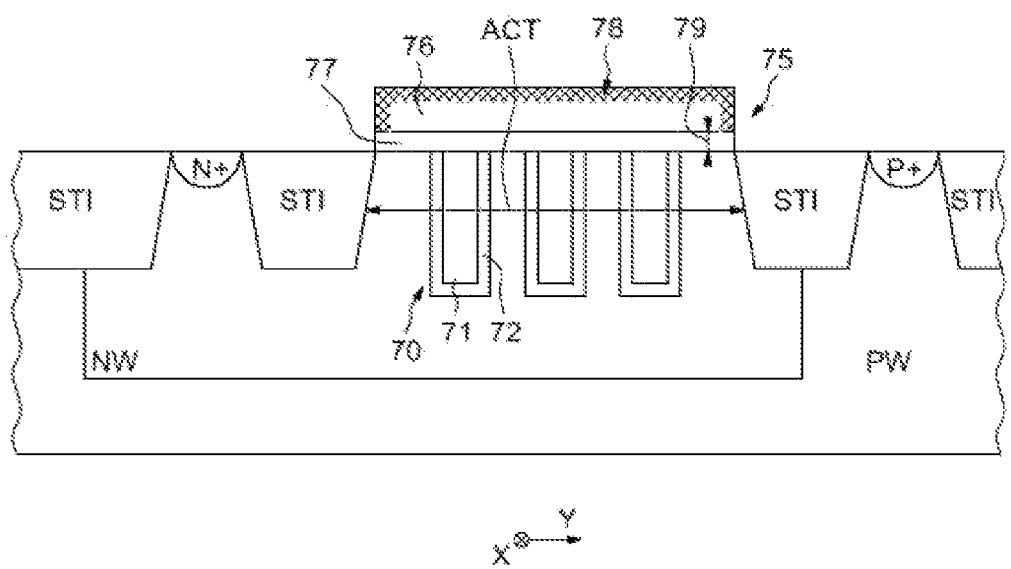
Figure 7D:
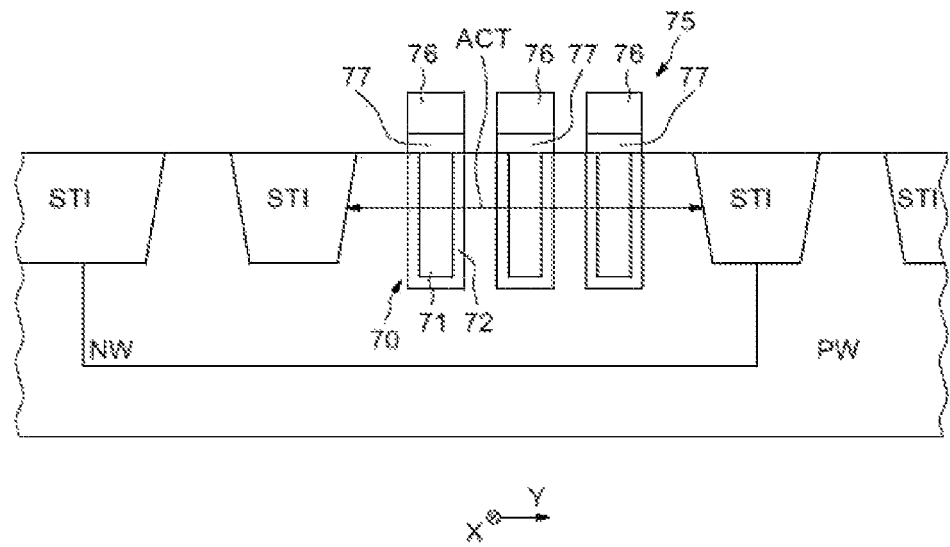

FIGS. 7C and 7D show examples of results of a step of forming at least one cover region 75 comprising an electrically conductive layer 76 resting on a dielectric layer 77. Said at least one cover region 75 totally covers the surface of a first part (pt1) of said at least one trench 70, located in the working area ACT.

For example, the formation of the dielectric layer 77 of the cover region 75 comprises the formation of a logic gate transistor gate oxide layer, or the formation of a stack of oxide-nitride-silicon oxide layers (ONO). A stack of the ONO type offers better performance as regards the reduction of the leakage current.

In the example of FIG. 7C, the formation of said at least one cover region 75 is carried out so as to form a plate covering the whole surface of the working area ACT.

In the example of FIG. 7D, the formation of said at least one cover region 75 is carried out so as to form strips arranged facing each trench 70.

Figure 7F:
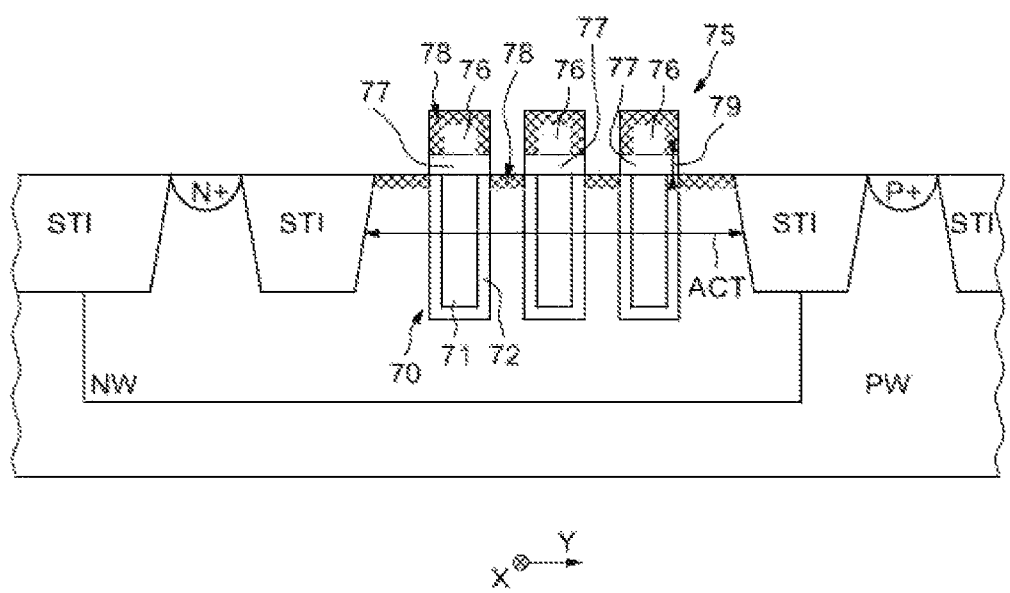

FIGS. 7E and 7F show examples of results of a step of silicidation carried out after the formation of said at least one cover region 75 on the structures described in relation to FIGS. 7C and 7D respectively.

The silicidation 78 is applied to the surfaces of the semiconductor parts of the structure being manufactured.

Thus, the method comprises, notably, silicidation 78 of a second part (pt2) of said central portion 71, this silicidation 78 being delimited by said cover region 75.

This delimitation of the silicidation at a distance 79 from the working area ACT operates in the same way as a hard mask to prevent the formation of short circuits, notably, between the conductive central portions 71 of the trenches 70 and the first semiconductor region NW.

For the filler capacitor cell 800, the manufacturing method as shown in FIGS. 7A-7F may be modified as follows. At the step shown in FIG. 7D, the formation of the cover region 85 (referenced as cover region 75) would include a shifting of the masking for forming the strips so that the dielectric layer 87 and the electrically conductive layer 86 are formed in alignment with the portion of the semiconductor well PW between adjacent trenches 80 instead of in alignment with the electrically conductive central portion 81 of each trench 80. Additionally, the formation of the cover region 85 would further include the formation of the sidewall spacers 88 for the strips. Such sidewall spacers may be formed using the common technique for sidewall spacer fabrication for MOSFET gate structures. For example, using a conformal deposition of an insulating material followed by etch to remove the insulating material from horizontal surfaces while preferentially preserving that material on vertical surfaces. At the step shown in FIG. 7F, the silicidation is carried out after the formation of the cover region 85 on the exposed semiconductive structures. Notably, this includes formation of the silicide 89 on the exposed portions of the electrically conductive central portion 81 of each trench 80.

For the filler capacitor cells 900 and 1000, the manufacturing method as shown in FIGS. 7A-7F may be modified as follows. At the step shown in FIG. 7D, the formation of the cover region 95, 105 (referenced as cover region 75) would include the formation of the sidewall spacers 98, 108 for the strips. Such sidewall spacers may be formed using the common technique for sidewall spacer fabrication for MOSFET gate structures. For example, using a conformal deposition of an insulating material followed by etch to remove the insulating material from horizontal surfaces while preferentially preserving that material on vertical surfaces. At the step shown in FIG. 7F, the silicidation is carried out after the formation of the cover region 95, 105 on the exposed semiconductive structures. Notably, this includes formation of the silicide 99, 109 on the exposed portions of the semiconductor well (in particular, the doped regions 94, 104) located between adjacent pairs of trenches.

Figure 6:
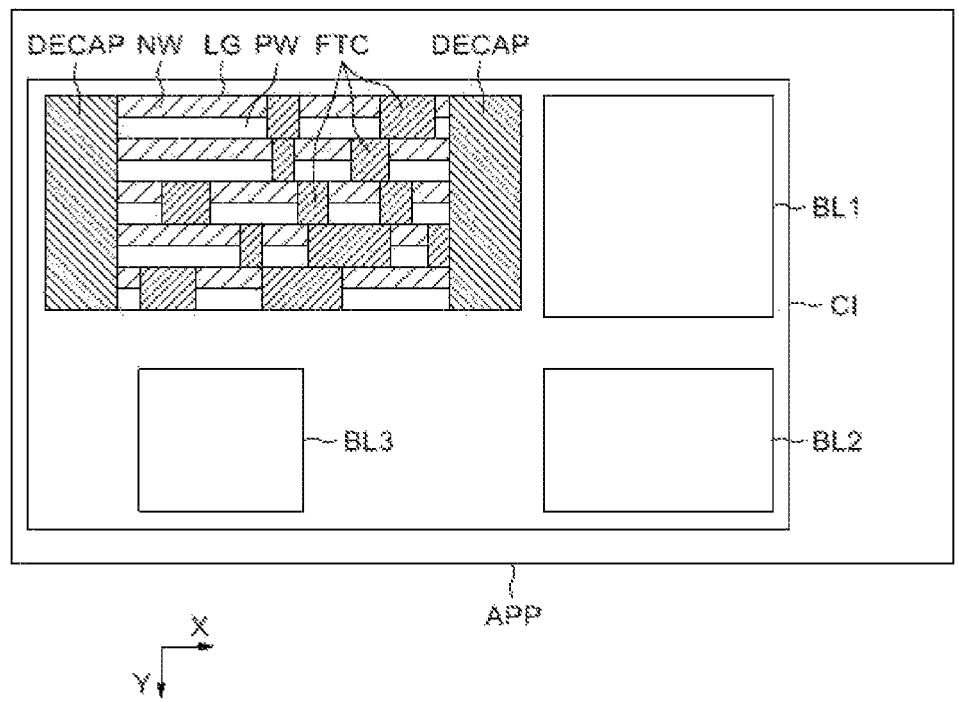
FIG. 6 shows an example of an electronic apparatus.

FIG. 6 shows an electronic apparatus APP, such as a mobile phone, an on-board computer of a vehicle, or any other known apparatus, comprising an integrated circuit CI having a domain LG comprising logic gates.

The logic part LG of the integrated circuit CI comprises a series of semiconductor wells NW having a first type of conductivity, for example n-type conductivity, and semiconductor wells PW having a second type of conductivity opposed to the first type of conductivity, for example p-type conductivity. The wells PW having the second type of conductivity may be the substrate, but will be denoted by the term "well(s)" in the following text.

The wells NW and PW are arranged in strips running along the length of the logic part (in a direction X) and may alternate laterally with one another (in a direction Y, perpendicular to the direction X). This enables logic cells to be made by complementary technology in a standard size.

The width of a logic cell of standard size, equal to 1.26 μm for example, corresponds to the width of a pair formed by a well NW and a well PW that are laterally adjacent.

The logic part LG comprises, due to its construction, spaces that are left empty (that is to say, spaces not comprising a logic cell), in which are formed filler capacitor cells FTC such as the filler capacitor cells 300, 400, 500, 800, 900, 1000 described herein with reference to FIGS. 3, 4, 5, 8, 9 and 10.

For example, the filler capacitor cells FTC form a decoupling capacitor, operating in combination with a dedicated decoupling capacitor component DECAP.

The integrated circuit CI further comprises other functional parts BL1, BL2, BL3 such as, in an example of an integrated memory circuit CI, a memory plan, a reading amplifier and a data bus interface.

The invention is not limited to the disclosed embodiments, but includes all variants thereof; for example, the numerical values and natures of the materials have been given by way of example, and furthermore the various arrangements of the examples of embodiment described above, particularly the arrangements of the trenches and the cover regions, may be combined independently from one embodiment to another without departing from the scope of the invention.

The invention claimed is:
1. A method, comprising:
   forming an isolating region delimiting a working area of a first semiconductor region;
   etching at least one trench in said working area;
   filling the at least one trench with an electrically conductive central portion insulated from bottom and sides of said at least one trench by an isolating layer;
   forming a cover region which covers at least a first part of said filled at least one trench, said cover region comprising at least one dielectric layer in contact with said filled at least one trench;
   siliciding at least the electrically conductive central portion of a second part of said at least one trench which is not covered by the cover region;
   making a first electrical contact to the first semiconductor region so as to form a first electrode of a filler capacitor cell device; and
   making a second electrical contact to the silicided electrically conductive central portion so as to form a second electrode of the filler capacitor cell device.
2. The method according to claim 1, wherein the first semiconductor region comprises a semiconductor well in a semiconductor substrate, the method further comprising electrically connecting a substrate electrical contact for the semiconductor substrate to the second electrical contact.
3. The method according to claim 1, wherein forming the cover region comprises forming an electrically conductive layer which is insulated from the filled at least one trench and the working area of the first semiconductor region by said at least one dielectric layer and further comprising electrically connecting the electrically conductive layer to the second electrical contact.
4. The method according to claim 3, wherein the at least one dielectric layer of the cover region comprises a transistor gate oxide layer.
5. The method according to claim 3, wherein the at least one dielectric layer of the cover region comprises a stack of oxide-nitride-silicon oxide layers.
6. The method according to claim 1, wherein etching at least one trench comprises etching a plurality of trenches which extend parallel to each other.
7. The method according to claim 6, wherein forming the cover region comprises forming the cover region in the shape of a plate which covers the plurality of trenches at the working area.

8. The method according to claim 6, wherein forming the cover region comprises forming the covering region in the shape of a plurality of strips arranged to cover only the filled plurality of trenches.

9. The method according to claim 8, further comprising making electrical contact to the working area at locations between adjacent strips of said plurality of strips.

10. The method according to claim 6, wherein forming the cover region comprises forming the covering region in the shape of a plurality of strips arranged to cover the working area between the filled plurality of trenches and extend partially over side edges of the filled plurality of trenches.

11. The method according to claim 10, wherein the second electrical contact to the silicided electrically conductive central portion is positioned between adjacent strips of said plurality of strips.

12. The method according to claim 6, wherein forming the cover region comprises forming the covering region in the shape of a plurality of strips arranged to cover the filled plurality of trenches and extend partially over side edges of the working area between the filled plurality of trenches.

13. The method according to claim 12, wherein the second electrical contact to the silicided electrically conductive central portion is positioned adjacent a longitudinal end of each strip of said plurality of strips.

14. The method according to claim 1, wherein said first part of said filled at least one trench is located in said working area.

15. The method according to claim 1, wherein said at least one trench extends in depth to a level below the isolating region.

16. A method, comprising:
forming an isolating region delimiting a working area of a semiconductor well;
forming a pair of trenches in the working area;
filling each trench of the pair of trenches with an electrically conductive central portion enclosed in an isolating enclosure;
forming a first doped region in a portion of the semiconductor well located between the pair of trenches;
forming a cover region including a pair of strips overlying said pair of trenches, wherein each strip includes an electrically conductive layer insulated from a corresponding one of the pair of trenches by a dielectric layer and a sidewall spacer, wherein the sidewall spacer extends over a side part of the portion of the semiconductor well located between the pair of trenches;
siliciding the first doped region in the portion of the semiconductor well located between the pair of trenches which is not covered by the sidewall spacer;
siliciding a part of the electrically conductive central portion;
siliciding the electrically conductive layer;
electrically connecting to the silicided first doped region to provide a first electrode of a filler capacitor cell device; and
electrically connecting to the silicided part of the electrically conductive central portion and the silicided electrically conductive layer to provide a second electrode of the filler capacitor cell device.

17. The method according to claim 16, further comprising:

forming a second doped region in another portion of the semiconductor well; and
electrically connecting between the second doped region and the silicided first doped region.

18. The method according to claim 16, further comprising:
forming a doped surface region in the semiconductor well, said doped surface region located between the pair of trenches;
forming a second doped region in a portion of the semiconductor well and in contact with the doped surface region; and
electrically connecting between said first electrical contact and the second doped regions.

19. The method according to claim 16, further comprising forming a buried doped region in the semiconductor well at a bottom of each trench of the pair of trenches.

20. A method, comprising:
forming an isolating region delimiting a working area of a semiconductor well;
forming a pair of trenches in the working area;
filling each trench of the pair of trenches with an electrically conductive central portion enclosed in an isolating enclosure;
forming a cover region including a strip overlying the working area between said pair of trenches, wherein said strip includes an electrically conductive layer insulated from the working area by a dielectric layer and a sidewall spacer, wherein the sidewall spacer extends over a side part of each trench of said pair of trenches;
forming a first doped region in the working area of the semiconductor well;
siliciding a part of the electrically conductive central portion;
siliciding the electrically conductive layer;
electrically connecting to the first doped region to provide a first electrode of a filler capacitor cell device; and
electrically connecting to the silicided part of the electrically conductive central portion and the silicided electrically conductive layer to provide a second electrode of the filler capacitor cell device.

21. The method according to claim 20, further comprising:
forming a second doped region in another portion of the semiconductor well; and
electrically connecting between the second doped region and the first doped region.

22. The method according to claim 20, further comprising:
forming a doped surface region in the semiconductor well, said doped surface region located between the pair of trenches;
forming a second doped region in a portion of the semiconductor well and in contact with the doped surface region; and
electrically connecting between said first electrical contact and the second doped regions.

23. The method according to claim 20, further comprising forming a buried doped region in the semiconductor well at a bottom of each trench of said pair of trenches.

* * * * *